US012787483B2

(12) United States Patent
Sahu et al.

(10) Patent No.: US 12,787,483 B2
(45) Date of Patent: Nov. 3, 2026

(54) SILVER NANOSTRUCTURES THIN FILM FOR INFRARED PHOTODETECTOR

(71) Applicant: NEW YORK UNIVERSITY, New York, NY (US)

(72) Inventors: Ayaskanta Sahu, Smithtown, NY (US); Håvard Mølnås, Brooklyn, NY (US); Shlok Joseph Paul, New York, NY (US)

(73) Assignee: New York University, New York, NY (US)

( * ) Notice: Subject to any disclaimer, the term of this patent is extended or adjusted under 35 U.S.C. 154(b) by 0 days.

(21) Appl. No.: 18/804,273

(22) Filed: Aug. 14, 2024

(65) Prior Publication Data

US 2025/0063850 A1 Feb. 20, 2025

Related U.S. Application Data

(60) Provisional application No. 63/519,406, filed on Aug. 14, 2023.

(51) Int. Cl.

| | |
|---|---|
| ***H10F 77/20*** | (2025.01) |
| ***B82Y 20/00*** | (2011.01) |
| ***C08K 7/06*** | (2006.01) |
| ***H10F 77/14*** | (2025.01) |

(52) U.S. Cl.

CPC ............ *H10F 77/254* (2025.01); *B82Y 20/00* (2013.01); *C08K 7/06* (2013.01); *H10F 77/1437* (2025.01); *H10F 77/147* (2025.01); *H10F 77/244* (2025.01); *C08K 2201/001* (2013.01); *C08K 2201/003* (2013.01); *C08K 2201/004* (2013.01); *C08K 2201/011* (2013.01)

(58) Field of Classification Search

CPC .. H10F 77/254; H10F 77/1437; H10F 77/147; H10F 77/244; B82Y 20/00; C08K 7/06; C08K 2201/011

See application file for complete search history.

(56) References Cited

U.S. PATENT DOCUMENTS

| | | | | |
|---|---|---|---|---|
| 10,749,048 B2 * | 8/2020 | Allemand | ............ | H10D 64/205 |
| 2014/0224321 A1 * | 8/2014 | Lim | ...................... | H10F 71/138 438/98 |
| 2014/0263945 A1 * | 9/2014 | Huang | ................... | H10K 30/65 257/40 |
| 2016/0064693 A1 * | 3/2016 | Moon | ................... | G02B 5/021 257/40 |

(Continued)

OTHER PUBLICATIONS

Amardeep Jagtap, Nicolas Goubet, Clément Livache, Audrey Chu, Bertille Martinez, Charlie Gréboval, Junling Qu, Erwan Dandeu, Loïc Becerra, Nadine Witkowski, Sandrine Ithurria, Fabrice Mathevet, Mathieu G. Silly, Benoit Dubertret, and Emmanuel Lhuillier The Journal of Physical Chemistry C 2018 122 (26), 14979-14985 DOI: 10.1021/acs.jpcc.8b03276.

(Continued)

*Primary Examiner* — Alonzo Chambliss
(74) *Attorney, Agent, or Firm* — Riverside Law LLP

(57) ABSTRACT

A product comprises a thin film comprising metal nanostructures in an optically transparent polymer, wherein a loading of the metal nanostructures ranges from 5-50 wt % and having a sheet resistance less than 20 Ohm/sq. Related devices and methods are also disclosed.

20 Claims, 25 Drawing Sheets

(56) References Cited

U.S. PATENT DOCUMENTS

2018/0366670 A1 * 12/2018 Allemand .............. H10K 30/20

OTHER PUBLICATIONS

Chih-Cheng Lin, Di-Yan Wang, Kun-Hua Tu, You-Ting Jiang, Meng-Hsiang Hsieh, Chia-Chun Chen, Chun-Wei Chen; Enhanced infrared light harvesting of inorganic nanocrystal photovoltaic and photodetector on graphene electrode. Appl. Phys. Lett. Jun. 27, 2011; 98 (26): 263509. https://doi.org/10.1063/1.3605682.

Final Report Summary—AIM4NP (Automated in-line Metrology for Nanoscale Production); accessed Aug. 8, 2024; https://cordis.europa.eu/project/id/309558/reporting.

G. Li, J. Zhao, Z. Wang, X. Yu, T. Zhao, X. Liang, R. Sun, L. Cao, P. Zhu, "Ultrathin, flexible, conductive silver nanowires@polyvinyl alcohol composite film fabricated via the combination of air plasma treatment and thermal sintering for electromagnetic interference shielding"; Mater. Lett. 2022, 325, 132814. DOI 10.1016/j.matlet.2022.132814.

H. Lu, J. Luo, Y. Liu, Y. Zhong, J. Wang, Y. Zhang, "Highly Performance Flexible Polymer Solar Cells by Flipping the Bilayer Film of Ag Nanowires and Polyvinyl Alcohol on Polyethylene Terephthalate as Transparent Conductive Electrodes"; IEEE J. Photovolt. 2019, 9, 710. DOI 10.1109/JPHOTOV.2019.2899469.

J. Kim, E. K. Ampadu, W. J. Choi, E. Oh, "Photocurrent spectra from PbS photovoltaic infrared detectors using silver nanowires as plasmonic nano antenna electrodes"; Nanotechnology 2019, 30, 075201. DOI 10.1088/1361-6528/aaf194.

K. A. Son, D. Wong, H. Sharifi, H. C. Seo, T. D. Lyon, S. Terterian, J. S. Moon, T. Hussain, "Silver Nanowire-Based Infrared-Transparent Contacts for Future High-Density Format Focal Plane Arrays"; IEEE Trans. Nanotechnol. 2015, 14, 10. DOI 10.1109/TNANO.2014.2366475.

S. Azadi, S. Peng, S. A. Moshizi, M. Asadnia, J. Xu, I. Park, C. H. Wang, S. Wu, "Biocompatible and Highly Stretchable PVA/AgNWs Hydrogel Strain Sensors for Human Motion Detection"; Adv. Mater. Technol. 2020, 5, 2000426. DOI 10.1002/admt.202000426.

S. Devaraju, et al.; "One-step fabrication of highly stable, durable, adhesion enhanced, flexible, transparent conducting films based on silver nanowires and neutralized PEDOT:PSS"; Mater. Adv., 2023, 4, 1769-1776; DOI: 10.1039/D3MA00031A.

T. H. Dang, M. Cavallo, A. Khalili, C. Dabard, E. Bossavit, H. Zhang, N. Ledos, Y. Prado, X. Lafosse, C. Abadie, D. Gacemi, S. Ithurria, G. Vincent, Y. Todorov, C. Sirtori, A. Vasanelli, E. Lhuillier, "Multiresonant Grating to Replace Transparent Conductive Oxide Electrode for Bias Selected Filtering of Infrared Photoresponse"; Nano Lett. 2023, 23, 8539. DOI 10.1021/acs.nanolett.3c02306.

W. Lan, Y. Chen, Z. Yang, W. Han, J. Zhou, Y. Zhang, J. Wang, G. Tang, Y. Wei, W. Dou, Q. Su, E. Xie, "Ultraflexible Transparent Film Heater Made of Ag Nanowire/PVA Composite for Rapid-Response Thermotherapy Pads"; ACS Appl. Mater. Interfaces 2017, 9, 6644. DOI 10.1021/acsami.6b16853.

X. He, R. He, A. I. Liu, X. Chen, Z. Zhao, S. Feng, N. Chen, M. Zhang, "A highly conductive, flexible, transparent composite electrode based on the lamination of silver nanowires and polyvinyl alcohol"; J. Mater. Chem. C 2014, 2, 9737. DOI 10.1039/C4TC01484G.

X. Tang, M. Chen, A. Kamath, M. M. Ackerman, P. Guyot-Sionnest, "Colloidal Quantum-Dots/Graphene/Silicon Dual-Channel Detection of Visible Light and Short-Wave Infrared"; ACS Photonics 2020, 7, 1117. DOI 10.1021/acsphotonics.0c00247.

X.-Y. Zeng, Q.-K. Zhang, R.-M. Yu, C.-Z. Lu, "A New Transparent Conductor: Silver Nanowire Film Buried at the Surface of a Transparent Polymer"; Adv. Mater. 2010, 22, 4484. DOI 10.1002/adma.201001811.

G. Li, J. Zhao, Z. Wang, X. Yu, T. Zhao, X. Liang, R. Sun, L. Cao, P. Zhu, "Ultrathin, flexible, conductive silver nanowires@polyvinyl alcohol composite film fabricated via the combination of air plasma treatment and thermal sintering for electromagnetic interference shielding"; Mater. Lett. 2022, 325, 132814. DOI 10.1016/j.matlet.2022.132814 , 4 pages.

* cited by examiner i ii iii i ii i ii

Results

| | |
|---|---|
| Image Raw Mean | 0.000004 nm |
| Image Mean | 0.000004 nm |
| Image Z Range | 606 nm |
| Image Surface Area | 84.7 µm$^2$ |
| Image Projected Surface Area | 77.8 µm$^2$ |
| Image Surface Area Difference | 8.84 % |
| Image Rq | 35.8 nm |
| Image Ra | 18.6 nm |
| Image Rmax | 606 nm |

| Pair | Horizontal Distance | Vertical Distance | Surface Distance |
|---|---|---|---|
| 1 | 7.502 (µm) | 349.374 (nm) | 9.589 (µm) |
| 2 | 7.454 (µm) | 365.526 (nm) | 9.689 (µm) |
| 3 | 7.454 (µm) | 330.782 (nm) | 8.623 (µm) |

| Pair | Horizontal Distance | Vertical Distance | Surface Distance |
|---|---|---|---|
| 1 | 4.452 (µm) | 149.501 (nm) | 4.615 (µm) |
| 2 | 3.425 (µm) | 120.910 (nm) | 3.626 (µm) |
| 3 | 4.843 (µm) | 162.812 (nm) | 5.051 (µm) |

| Pair | Horizontal Distance | Vertical Distance | Surface Distance |
|---|---|---|---|
| 1 | 10.842 (µm) | 65.111 (nm) | 11.504 (µm) |
| 2 | 10.685 (µm) | 68.270 (nm) | 11.241 (µm) |
| 3 | 10.685 (µm) | 70.990 (nm) | 11.105 (µm) |
| 4 | 10.685 (µm) | 73.975 (nm) | 10.980 (µm) |

i ii i ii i ii i ii i ii iii i ii

KPFM of Ag nanowires

$$\varphi^{sample} = \varphi^{tip} + e.CPD^{sample}$$

Measure CPD = -0.067 V $\varphi^{sample}$ = 4.68eV + e (-0.067)

$\varphi^{sample}$ = 4.613 eV

SILVER NANOSTRUCTURES THIN FILM FOR INFRARED PHOTODETECTOR

CROSS-REFERENCE TO RELATED APPLICATIONS

This application claims priority to U.S. provisional application No. 63/519,406 filed on Aug. 14, 2023, incorporated herein by reference in its entirety.

STATEMENT REGARDING FEDERALLY SPONSORED RESEARCH OR DEVELOPMENT

This invention was made with government support under N00014-20-1-2231 awarded by the Office of Naval Research and D21AP10118 awarded by the Defense Advanced Research Projects Agency. The government has certain rights in the invention.

BACKGROUND OF THE INVENTION

Infrared (IR) photodetection is becoming increasingly important in today's society, with applications extending far beyond traditional high-end usage in military intelligence and space exploration. In particular, IR photodetectors based on colloidal quantum dots have shown competitive performance compared to state-of-the-art bulk materials in a laboratory setting. Infrared (IR) photodetection has historically been used in high-end applications such as space exploration and for military intelligence purposes but is becoming increasingly important in today's society through new applications in agriculture, medicine, search-and-rescue, machine vision and in personal devices. Colloidal quantum dots (CQDs) have been predicted to disrupt status quo in many areas of technology including but not limited to energy harvesting, lighting, sensing, and computing due to their immense tunability, ease of fabrication, solution processability and compatibility with both flexible and rigid substrates.

Silver nanowire (Ag NW) mesh has been investigated as a potential material for transparent electrodes and has also been used as a top contact for infrared photodetectors. However, Ag NW films have been shown to have poor mechanical adhesion to the substrate, weak nanowire-nanowire bonding, inhomogeneous resistance distribution, high haze (strong light scattering), also a risk of Ag oxidation and joule heating at contact points, potentially leading to degradation.

See Zeng, X.-Y., Zhang, Q.-K., Yu, R.-M., Lu, C.-Z., A New Transparent Conductor: Silver Nanowire Film Buried at the Surface of a Transparent Polymer, Advanced Materials, 2010, 22, 4484-4488, the entire disclosure of which, except for any definitions, disclaimers, disavowals, and inconsistencies, is incorporated herein by reference.

Zeng et al. introduced a new transparent conductor by burying the Ag NW film at the surface of a PVA film to address some of these problems. Since Zeng, Ag NW-PVA composite as a transparent conductive electrode (TCE) has been adapted for OLEDs and solar cells, as a thin-film heater, for electromagnetic shielding, or as a strain sensor. Carbon nanofibers (CNF) have also been added to reinforce the composite. Common for most of these studies is that Ag NW and PVA may be deposited sequentially followed by a curing process (heating, freezing, pressing, etc.).

However, there exist limitations in current materials adapted as top contacts of IR photodetectors. Specifically, current top electrode materials absorb significant amounts of mid-wave infrared radiation (MWIR), reducing the optical signal reaching the active absorber layer of the photodetector, and reducing the device efficiency. In order to circumvent this issue, a less efficient lateral geometry can be utilized, or the more efficient vertical photodiode geometry illuminated through a transparent bottom substrate. However, this geometry is not compatible with a ROIC and cannot be used as an IR imager since the substrate incorporating the electronics would not be IR transparent. Furthermore, the existing technology requires specialized and expensive deposition equipment and/or is not solution-based and/or is not compatible with flexible substrates. Additionally, sensors based on state-of-the-art bulk materials such as mercury cadmium telluride (MCT), indium gallium arsenide (InGaAs) and lead sulfide (PbS) are toxic, expensive, and some require cooling during operation to minimize dark currents and reach the highest wavelengths.

Additionally, the performance of several IR-active semiconductor QDs degrade under ambient conditions, thus one or more encapsulating layers are typically necessary to achieve long term stability for devices. Polymers such as polyvinyl alcohol (PVA) and polyvinylidene fluoride (PVDF) can serve as oxygen ($O_2$) and water ($H_2O$) repellants, respectively, while polyimide (PI) has been shown to reduce ion migration. Great care has to be taken in the selection and thickness of these encapsulants to maximize transmission, which currently takes place in a separate deposition step. Some devices disclosed herein incorporate conductive Ag NW in an encapsulating PVA matrix deposited in one step, which is able to provide a degree of device encapsulation.

Fabricating IR-active photodetectors in a vertical photodiode structure requires at least one contact transparent to infrared radiation. E-beam evaporated nickel chromium (NiCr) alloy was used in an early report on HgTe MWIR photovoltaic devices but having a transmittance of only 30%, it was quickly replaced by more transmissive materials. Indium doped tin oxide (ITO) and fluorine doped tin oxide (FTO) exhibit high transmittance into the short-wave infrared (SWIR) and mid-wave infrared (MWIR), respectively, but deposition and patterning requires specialized equipment and techniques such as access to a nanofab. Additionally, the resulting oxide films are brittle and could crack upon bending and are thus not suitable for flexible devices. Zirconium (Zr) doped ITO has also been utilized in a recent report. Thin gold (Au) films have been used, but due to the significant limitations on film thickness in order to achieve acceptable transmittance there is a risk of forming noncontinuous films/islands. Patterned aluminum (Al) has also been reported in the literature, however relying heavily on horizontal carrier transport in a vertical architecture, likely reducing the charge extraction and effectively the EQE. Chemical vapor deposited (CVD) single layer graphene has nearly 97% transparency over the MWIR range, but again requires costly/advanced equipment. Graphene oxide is another solution-processable alternative, however contact uniformity issues and partial MWIR absorption was reported.

Accordingly, there exists a need given the limited selection of affordable, IR transparent top contacts compatible with a readout integrated circuit.

SUMMARY OF THE INVENTION

In one aspect, a product comprises a thin film comprising metal nanostructures in an optically transparent polymer, wherein a loading of the metal nanostructures ranges from 5-50 wt % and having a sheet resistance less than 20 Ohm/sq.

In one embodiment, the product has a sheet resistance of less than 15 Ohm/sq, less than 10 Ohm/sq, less than 5 Ohm/sq, less than 1 Ohm/sq, 1-5 Ohm/sq, 5-10 Ohm/sq, 10-15 Ohm/sq, and/or 15-20 Ohm/sq.

In one embodiment, the metal nanostructures comprise more than one type of metal.

In one embodiment, the metal nanostructures comprise silver, gold, platinum, and/or copper.

In one embodiment, the polymer is at least 50%, at least 60%, at least 70%, at least 75%, at least 80%, at least 90%, at least 95%, and/or at least 99% transparent. The polymer may in various embodiments be partially or fully transparent to visible light, near infrared light, infrared light, ultraviolet light, or some combination of these.

In one embodiment, the metal nanostructures are nanowires that have a diameter in the range of 10 to 200 nm and have a length in the range of 10 to 50 μm.

In one embodiment, the metal nanostructures are nanowires that have a diameter in the range of 110 nm to 130 nm and have a length in the range of 30 to 50 μm.

In one embodiment, the metal nanostructures are nanowires that have a diameter in the range of 10-200 nm, 10-50 nm, 30-50 nm, 50-100 nm, 100-150 nm, and/or 150-200 nm.

In one embodiment, the metal nanostructures are nanowires that have a length in the range of 10-50 μm, 10-20 μm, 20-30 μm, 20-40 μm, 30-40 μm, and/or 40-50 μm.

In one embodiment, the metal nanostructures are distributed such that metal nanostructure junctions are established to create a spatially uniform sheet resistance. As disclosed herein, "spatially uniform sheet resistance" may refer to a sheet resistance that varies by less than +/−10%, less than +/−5%, less than +/−2%, or less than +/−1% across the sheet.

In one embodiment, the metal nanostructures are sufficiently loaded such that the metal nanostructures junctions are established to create a stable sheet resistance.

In one embodiment, the metal nanostructures comprise nanowires.

In one embodiment, the nanowires have a diameter in the range of 10 to 200 nm and have a length in the range of 10 to 50 μm.

In one embodiment, the nanowires have a diameter in the range of 110 nm to 130 nm and have a length in the range of 30 to 50 μm.

In one embodiment, the loading of metal nanostructures ranges from 10-30 wt %, 5-10 wt %, 10-20 wt %, 20-30 wt %, 30-40 wt %, and/or 40-50 wt %.

In one embodiment, the optically transparent polymer comprises polyvinyl alcohol (PVA).

In another aspect, an opto-electronic device comprises a bottom contact, a plurality of layers of semiconducting materials positioned over the bottom contact, and a top contact positioned over the semiconductor diode, the top contact comprising a thin film of an optically transparent polymer with a plurality of metal nanowires suspended therein, wherein a loading of the metal nanowires in the polymer thin film is between 5 and 50 wt %.

In another aspect, method of fabricating a composite film comprises dissolving a quantity of an optically transparent polymer in a solvent under stirring, heating the dissolved quantity of polymer and solvent to form a polymer stock solution having a polymer concentration of 1-10% wt, adding a quantity of metal nanowires in a second stock solution to the polymer stock solution to form an metal nanowire polymer mixture, mixing the metal nanowire polymer mixture, depositing the metal nanowire polymer mixture onto a substrate to form a thin film, annealing the thin film, and vacuum drying the annealed thin film to form a composite film.

In one embodiment, the solvent comprises isopropyl alcohol, ethanol, methanol, and/or distilled water.

In one embodiment, the deposition comprises inkjet printing, spin coating, spray coating, dip coating, or drop coating.

In one aspect of the present invention, a product includes a thin film comprising Ag nanostructures in polyvinyl alcohol (PVA), wherein a loading of Ag nanostructures ranges from 10-30 wt % and having a sheet resistance less than 12 Ohm/sq. In one embodiment, the Ag nanostructures may be nanowires that may have a diameter around 30 to 170 nm and may have a length from 30 to 50 μm. Alternatively, the nanowires may have smaller diameter around 120 nm with a length from 30 to 50 μm. In another embodiment, the Ag nanostructures are sufficiently loaded such that the Ag nanostructures junctions are established to create a stable sheet resistance. Additionally, the Ag nanostructures may be nanowires to create said junctions. The Ag nanowires may have a diameter of 120 nm and have a length from 30 to 50 μm described above.

In another aspect of the present invention, a photodiode includes a bottom contact; a layer of semiconducting material positioned over the bottom contact; and a top contact positioned over the semiconducting material, the top contact comprising a thin film of polyvinyl alcohol (PVA) with a plurality of Ag nanowires suspended therein; wherein a loading of the Ag nanowires in the PVA thin film is between 10 and 30 wt %. Alternatively, the aforementioned photodiode may include nanostructures. In one embodiment, the Ag nanostructures may be nanowires that may have a diameter around 30 to 170 nm and may have a length from 30 to 50 μm. Alternatively, the nanowires may have smaller diameter around 120 nm with a length from 30 to 50 μm.

In another aspect of the present invention, a method of fabricating a composite film, includes: dissolving a quantity of polyvinyl alcohol (PVA) in distilled water under stirring; heating the dissolved quantity of PVA and distilled water to form a PVA stock solution having a PVA concentration of about 5% wt; adding a quantity of Ag nanowires in IPA stock solution to the PVA stock solution to form an Ag nanowire PVA mixture; mixing the Ag nanowire PVA mixture; spin coating the AG nanowire PVA mixture onto a substrate to form a thin film; annealing the thin film; and vacuum drying the annealed thin film to form a composite film. Alternatively, the aforementioned method may include nanostructures. In one embodiment, the Ag nanostructures may be nanowires that may have a diameter around 30 to 170 nm and may have a length from 30 to 50 μm. Alternatively, the nanowires may have smaller diameter around 120 nm with a length from 30 to 50 μm.

BRIEF DESCRIPTION OF THE DRAWINGS

The foregoing purposes and features, as well as other purposes and features, will become apparent with reference to the description and accompanying Figures below, which are included to provide an understanding of the invention and constitute a part of the specification, in which like numerals represent like elements, and in which:

FIG. 1A relates to Scanning Electron Microscope (SEM) images. FIG. 1A (i) shows 10 wt % Ag NWs. ~20% of the cross-sectional area is covered by NWs. FIG. 1A (ii) shows 20 wt % Ag NWs. ~40% of the cross-sectional area is covered by NWs. FIG. 1A (iii) shows 30 wt % Ag NWs. ~49% of the cross-sectional area is covered by NWs. FIG. 1A (iv) shows close-up of Ag NW intersection. FIG. 1B (i-iii) is the supporting information for FIG. 1A.

FIG. 2A (i) relates to said composite films on exemplary materials such as glass or sapphire. Transmittance for Ag NW-PVA composite films with different theoretical Ag NW content: 10% (top curve), 20% (middle curve), and 30% (bottom curve). FIG. 2A (i) depicts Vis-NIR-SWIR range based on UV-Vis measurements on glass with dips around ~400 nm is due to Ag absorption. FIG. 2A (ii) depicts E-SWIR-MWIR range based on FTIR measurements on sapphire with dips around ~3000-3500 nm due to OH and C—H stretch. Ag NW content: 10% (top curve), 20% (middle curve), and 30% (bottom curve).

FIG. 2B are graphs showing additional transmittance results to exemplary Ag NW-PVA composite films. FIG. 2B (i) relates to Pure PVA (0% Ag NW, dark curve) with static deposits with post vacuum treatment. FIG. 2B additionally shows Ag NW stock solution (20 mg/mL in IPA, lighter curve). FIG. 2B (ii) relates to transmittance 100% PVA and 100% Ag NW and Ag NW-PVA films before/after vacuum treatment. FIG. 2B (ii) shows increased transmittance after vacuum treatment which is likely due to removal of trapped solvent potentially scattering incoming light.

FIG. 2C depicts AFM evaluation of 10 wt % Ag NW-PVA film on glass. Average thickness 348.6 nm. FIG. 2D depicts AFM evaluation of 20 wt % Ag NW-PVA film on glass. Average thickness 144.4 nm. FIG. 2E depicts AFM evaluation of 30 wt % Ag NW-PVA film on glass. Average thickness 45.6 nm/69.1 nm.

FIG. 4A (i) depicts 10% Ag NW in PVA (bottom line), 20% Ag NW in PVA (middle line), and 30% Ag NW in PVA (top line) top contact, illumination through top contact. FIG. 4A (ii) depicts a Twin device with 100 nm thermally evaporated Ag top contact, illuminated through the top contact (bottom line) and through the substrate (top line).

FIG. 4B (i) depicts Responsivities for three devices on the same substrate. For the values on red background, the input power has been estimated. FIG. 4B (ii) depicts on/off ratios.

FIG. 4C depicts specific detectivities at 0V applied bias for four HgTe CQD vertical devices with 20 wt % Ag NW-PVA composite top contact on day 6 after fabrication. For the values on red background, the input power has been estimated. FIG. 4C (i) depicts D* with illumination through top contact. FIG. 4C (ii) depicts D* with illumination through substrate.

FIG. 4D (i) depicts responsivities. FIG. 4D (ii) depicts on/off ratios.

FIG. 4E (i) depicts responsivities. FIG. 4E (ii) depicts on/off ratios.

FIG. 4F (i) shows a side view of vertical device structure ("Gen2"—February 2023). Active device area was 0.4 $cm^2$. FIG. 4F (ii) depicts noise measured in a dark, shielded enclosure at 0V applied bias for four HgTe CQD vertical devices with 20 wt % Ag NW-PVA composite top contact (solid lines) and preamp (dashed line). Specific detectivities were calculated at 25 Hz.

FIG. 4G (ii) depicts specific detectivity at 25 Hz and 0V applied bias for twin vertical HgTe photodetectors with 20 wt % Ag NW-PVA (black squares) or thermally evaporated Ag top contacts (blue squares) illuminated through the substrate. These results demonstrate that the Ag NW-PVA top contact is as transparent as the bottom substrate, and as an electrode, it performs similarly to evaporated Ag. Illuminated through the top contact, the twin devices with thermally evaporated Ag perform an order of magnitude poorer.

FIG. 5A depicts device geometry and optical images of vertical HgTe devices. FIG. 5A (i) shows a side view of the vertical device architecture that was used to compare the performance of Ag NW-PVA composite top electrode to traditional thermally evaporated Ag. FIG. 5A (ii) depicts a side view of a vertical device geometry ("Gen3"—March 2023). FIG. 5A (iii) depicts a top view of a device with an Ag NW-PVA top contact. Active device area (0.0918 $cm^2$) is indicated by the red rectangle. FIG. 5A (iii) further depicts a top view of a device with thermally evaporated Ag top contact.

FIGS. 5B and 5C show responsivity data and noise current spectral density for vertical photodetectors with Ag NW-PVA composite and thermally evaporated Ag top contacts at 0V applied bias, respectively. FIG. 5B (i) depicts responsivities and FIG. 5B (ii) depicts noise measurements for vertical photodetectors with Ag NW-PVA top contact at 0V applied bias. For the responsivity values on red background, the input power has been estimated. Noise measurements at 25 Hz were used to calculate the specific detectivity, D*. FIG. 5C (i) depicts responsivities and FIG. 5C (ii) depicts noise measurements for vertical photodetectors with thermally evaporated Ag top contact at 0V applied bias. For the responsivity values on red background, the input power has been estimated. Noise measurements at 25 Hz were used to calculate the specific detectivity, D*.

FIG. 7A depicts thermogravimetric analysis (TGA) spectra. FIG. 7A (i) depicts 20% Ag NW-PVA composite mixed solution and films. FIG. 7A (ii) depicts 100% Ag NW: PVP and 100% PVA (MW 85,000-124,000). FIG. 7B depicts an exemplary method for Ag NW-PVA composite thin film fabrication.

FIG. 8A (i) depicts device architecture for a vertical HgTe CQD-Ag NW-PVA photodiode with $Ag_2$ Te hole transport layer instead of $MoO_3$. Active device area was 0.15 $cm^2$. FIG. 8A (ii) depicts a device architecture for optimized vertical HgTe CQD-Ag NW-PVA photodiode with $Ag_2Te$ hole transport layer and $SnO_2$ electron transport layer instead of $TiO_2$. Active device area was 0.093 $cm^2$. FIG. 8A (iii) depicts specific detectivities at 140 Hz and 0V applied bias for the device architecture in FIG. 8A (i). FIG. 8A (iv) depicts specific detectivities at 140 Hz and 0V applied bias for the device architecture in FIG. 8A (ii).

FIG. 8B (i) depicts responsivity for a vertical HgTe CQD-Ag NW-PVA photodiode with $Ag_2$ Te hole transport layer instead of $MoO_3$. FIG. 8B (ii) depicts responsivity for a vertical HgTe CQD-Ag NW-PVA photodiode with $Ag_2Te$ hole transport layer and $SnO_2$ electron transport layer instead of $TiO_2$. FIG. 8B (iii) depicts on/off ratios for the device architectures. FIG. 8B (iv) depicts noise current spectral density for the device architectures.

FIG. 8C (i) depicts current density-voltage (J-V) curves on a linear scale for an a vertical HgTe CQD-Ag NW-PVA photodiode with $Ag_2Te$ hole transport layer instead of $MoO_3$ in the dark (black spheres) and under 970 nm illumination at 100 mW/cm (red spheres). Active device area was 0.3 $mm^2$. FIG. 8C (ii) depicts absolute current density plotted on a logarithmic scale against voltage on a linear scale for an a vertical HgTe CQD-Ag NW-PVA photodiode with $Ag_2Te$ hole transport layer instead of $MoO_3$ in the dark (black spheres) and under 970 nm illumination at 100 mW/cm (red spheres).

DETAILED DESCRIPTION

Figure 1A:
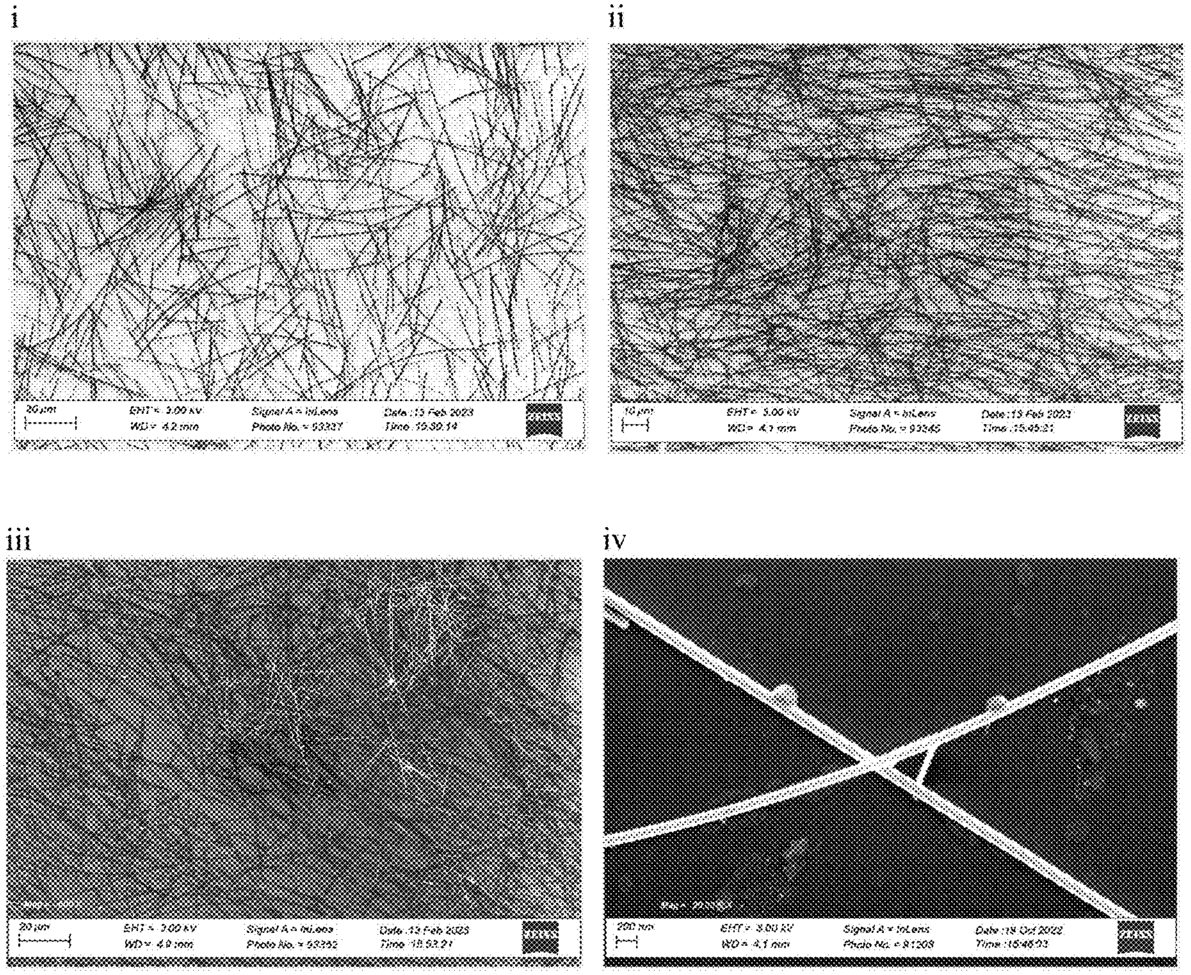
FIGS. 1A-B are photos related to exemplary Ag NW-PVA composite samples.

It is to be understood that the Figures and descriptions of the present invention have been simplified to illustrate elements that are relevant for a clear understanding of the present invention, while eliminating, for the purpose of clarity, many other elements found in related systems and methods. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

As used herein, "Metal nanowires" are nanostructures with diameters that are typically in a range of 5-400 nm, and lengths in a range of 1-500 μm. In some embodiments, metal nanowires have many unique properties that are not seen in their bulk counterparts, such as good thermal and electrical conductivity, high aspect ratio, low sheet resistance, and, when arranged in a mesh, excellent optical transparency.

Widespread use of CQD-based FPAs in combination with an ROIC for affordable IR imaging requires/calls for uncomplicated/"low-tech" (and ideally solution-processable) IR transparent top contacts. In one aspect of the present invention, a silver nanowire polyvinyl alcohol (Ag NW-PVA) composite is disclosed which has high (>70%) transmittance in the near-IR, short-wave IR (SWIR) and MWIR, low and tunable sheet resistance, and can be deposited in a simple spin coating procedure onto a wide range of substrates. In one aspect of the invention, integration of this composite as a top contact in a vertical photodetector geometry operating in the SWIR is disclosed. This positions the Ag NW-PVA composite as a promising IR transparent top contact for the development of future IR imagers.

PRODUCT

Optical Properties

Referring now to FIG. 1A, shown are SEM micrographs of Ag NW in PVA composite films on silicon with different theoretical Ag NW loading (10-30 wt %). The Ag NWs, supplied as diameter Ø120 nm and length 30-50 μm, can be observed as dark wire structures embedded in the lighter PVA matrix. Conductive pathways are formed even at 10% loading (FIG. 1A (i)), and the interconnectivity increases significantly with increasing loading (FIG. 1A (ii-iii)), while leaving significant areas uncovered by NWs (>50% based on analysis of 2D segments in ImageJ, shown in FIG. 1B), enabling transmittance of electromagnetic radiation. FIG. 1A (iv) shows a close-up of the intersection of two Ag NWs.

Figure 1B:
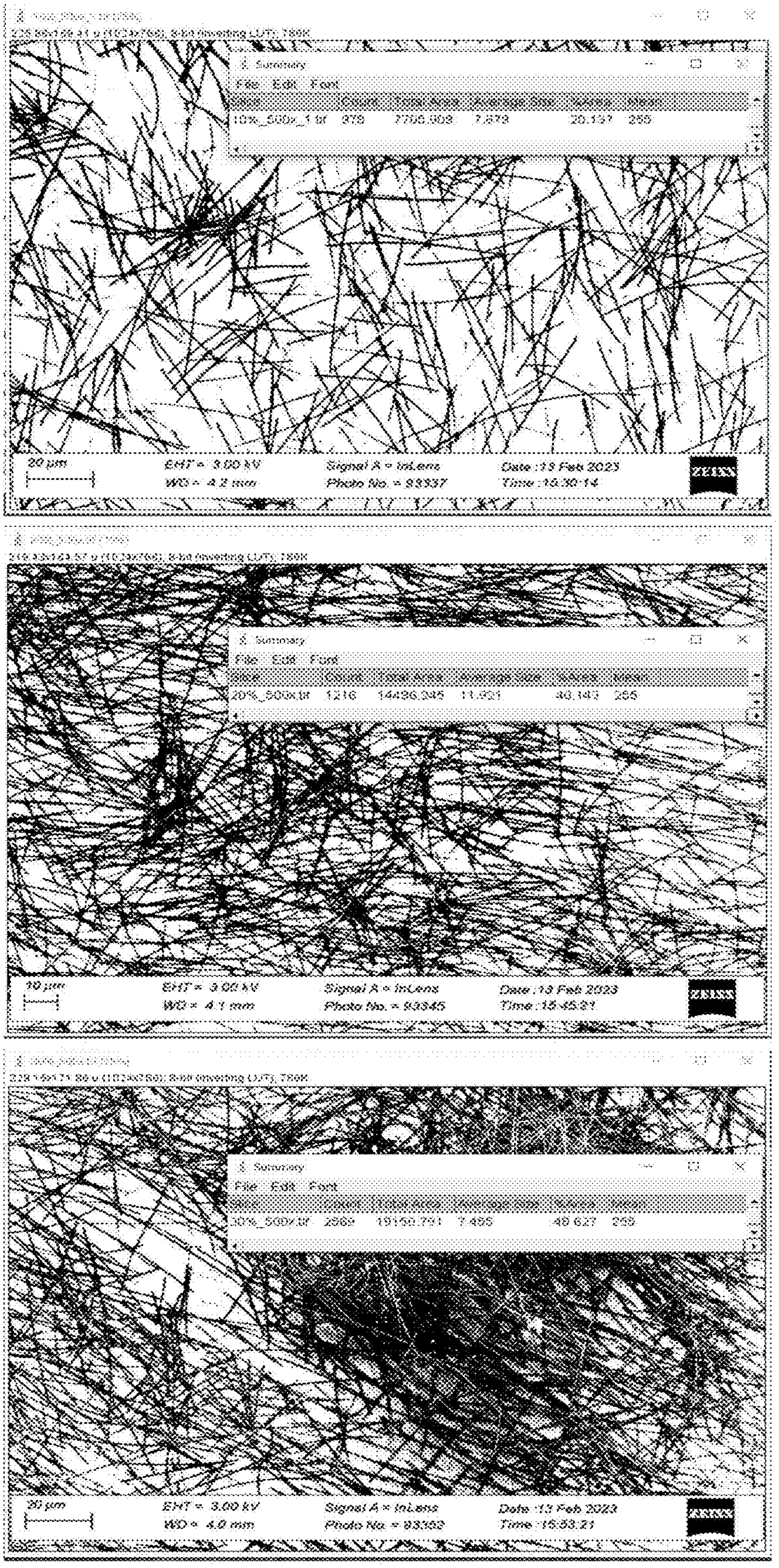

Referring now to FIG. 1B, the results of an evaluation of NW area in a 2D section of Ag NW-PVA composite films are shown using ImageJ software. The area covered by Ag NWs increased with increasing theoretical Ag NW loading, as expected. FIG. 1B (i) shows 10% Ag NW. Ag NWs cover 20.1% of the area. FIG. 1B (ii) shows 20% Ag NW. Ag NWs cover 40.1% of the area. FIG. 1B (iii) shows 30% Ag NW. Ag NWs cover 48.6% of the area.

Figure 2A:
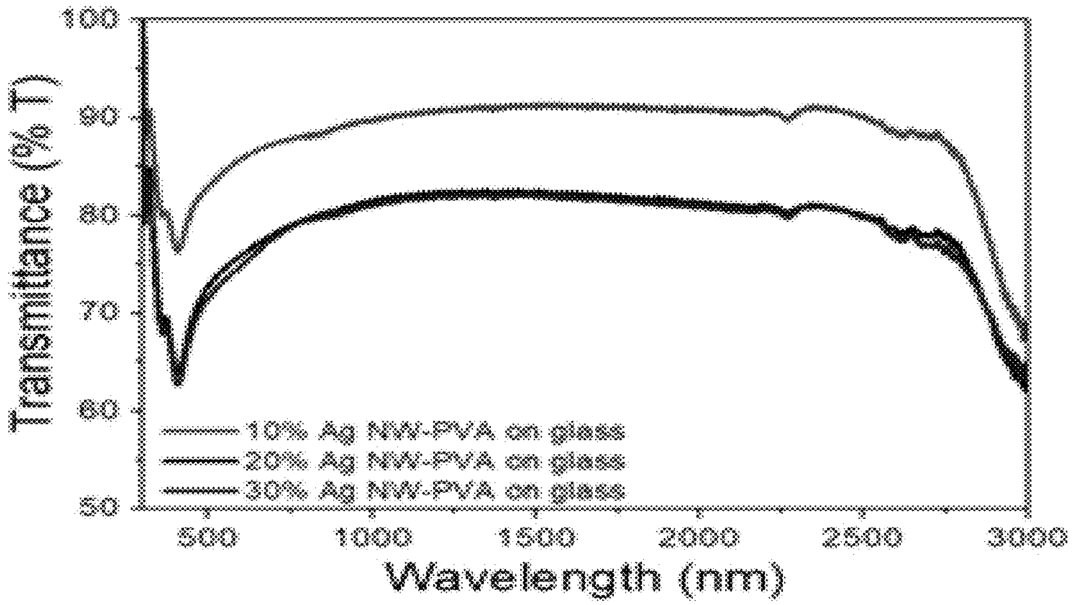
FIG. 2A to 2B are graphs of transmittance results related to exemplary Ag NW-PVA composite films.
Figure 2A:
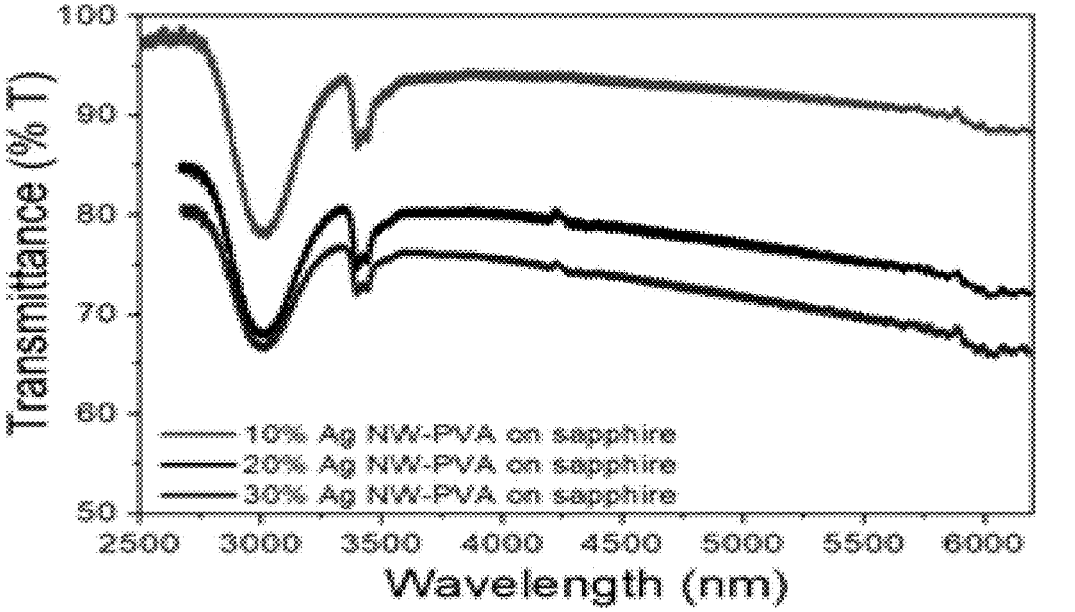

Referring now to FIG. 2A, transmittance results are shown for Ag NW-PVA composite films with different theoretical Ag NW content in the wavelength range 300-3000 nm (FIG. 2A (i)) and 2500-6200 nm (FIG. 2A (ii)). Films were deposited on glass and sapphire, respectively, and the results were background corrected. The composite films show high transmittance (>70%) from the NIR (0.7-1.4 μm), through the SWIR (1.4-3 μm) and into the MWIR range (3-5 μm) and beyond. Reduced transmittance at ~400 nm is due to the absorption in the Ag NWs, while reduced transmittance at ~3000-3500 nm is due to the C—H and O—H stretch in the PVA.

Figure 2B:
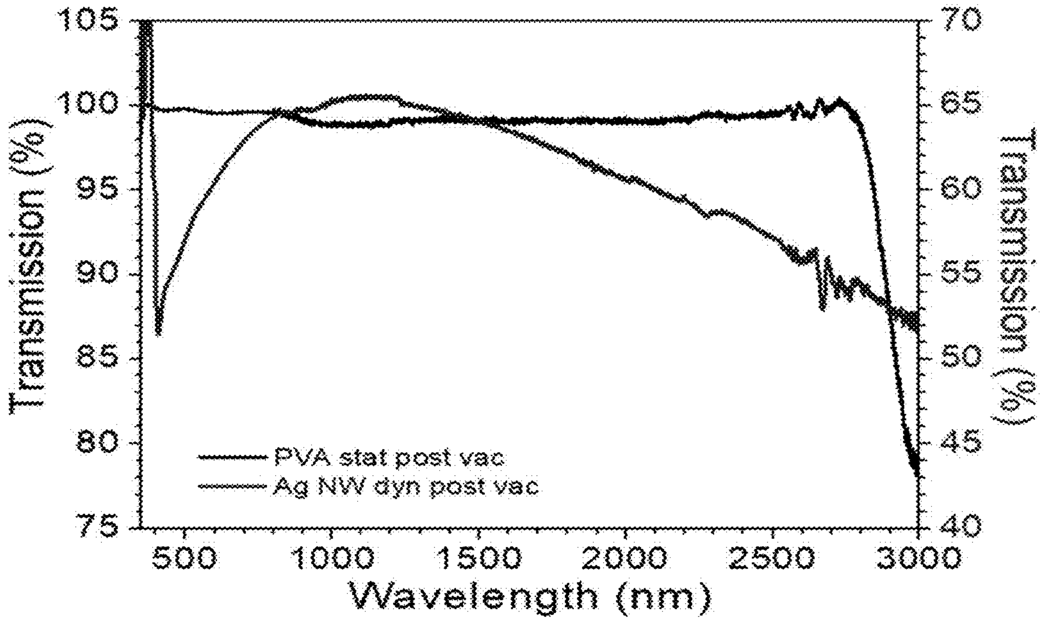
Figure 2B:
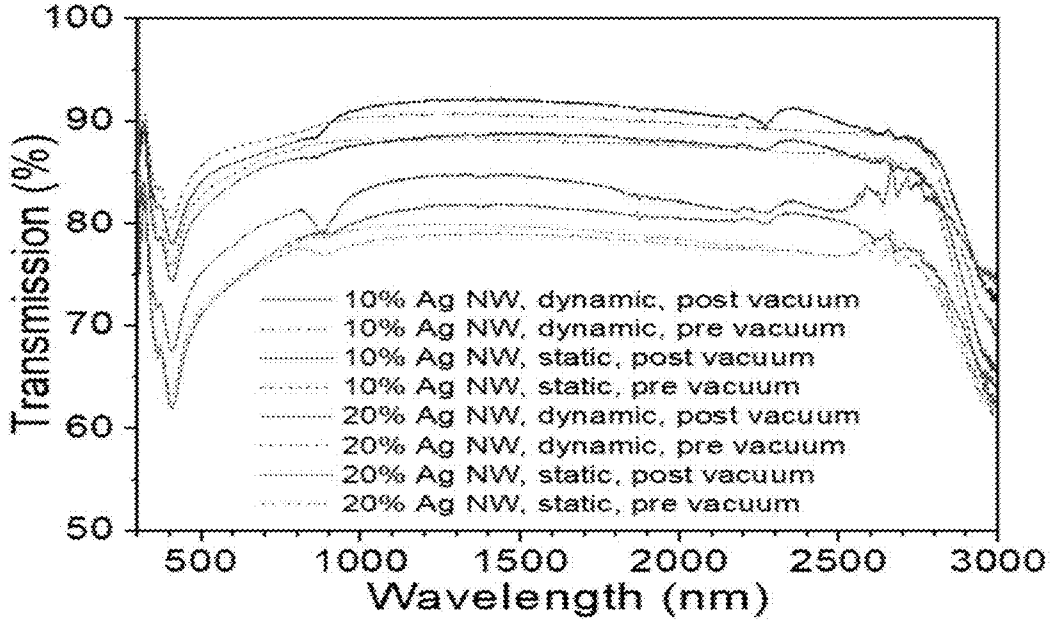

Referring now to FIG. 2B, additional transmittance data is shown. Compared to traditional IR photodetector contacts like ITO and FTO, having a MWIR transmittance of <50%, the films show improved performance while being significantly easier to deposit at a lower initialization price point. FIG. 2B shows additional transmittance results for films spin coated from 100% PVA stock solution and 100% Ag NW stock solution, as well as Ag NW-PVA composite films from dynamically and statically deposited 10% and 20% Ag NW mixed solutions before and after vacuum treatment. While 100% PVA has almost complete transmittance up to 2800 nm, the 100% Ag NW film has peak transmittance of 65% at 1000 nm. The Ag NW-PVA composite films show increased transmittance after vacuum treatment, likely due to removal of trapped solvents scattering incoming radiation.

The transmittance shows dependence on theoretical Ag NW loading, as expected based on previous reports and SEM images in FIG. 1A. However, while SEM images mainly visualize the situation in 2D, the film transmittance is obviously a 3D-effect influenced by achieved film thickness. In accordance with AFM data shown in FIGS. 2C, 2D, and 2E, the average film thicknesses were determined as 349 nm, 144 nm, and 57 nm for 10%, 20% and 30% theoretical Ag NW loading, respectively. With spin coating parameters kept identical for all three Ag NW concentrations, the film thickness is mainly a result of the different viscosities of the mixed solutions. Since the film with the lowest theoretical Ag NW loading also has the largest average thickness, the Ag NW concentration per vertical cross section is significantly smaller at 10% than at 20% and 30% theoretical loading, substantiating the notable difference in transmittance.

Figure 2C:
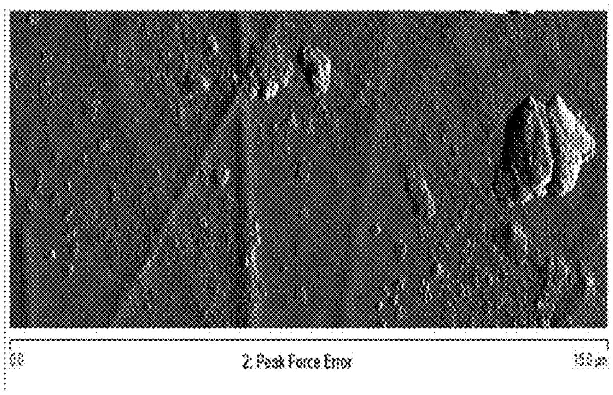
FIGS. 2C to 2E depict Atomic Force Microscope (AFM) photos and thickness measurements thereto on the exemplary Ag NW-PVA composite films on exemplary material of glass.
Figure 2C:
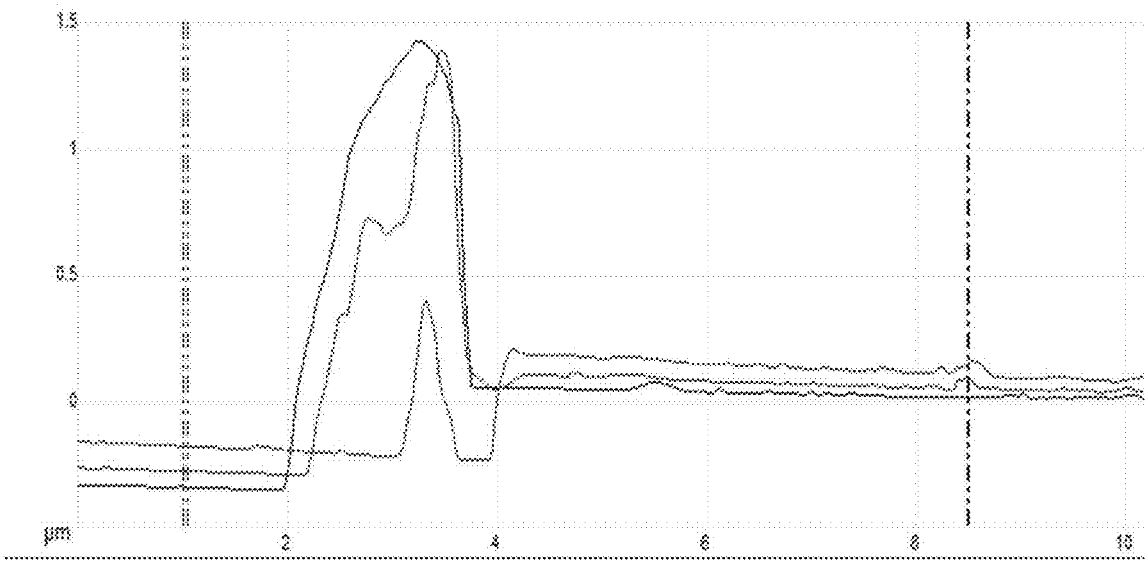
Figure 2C:
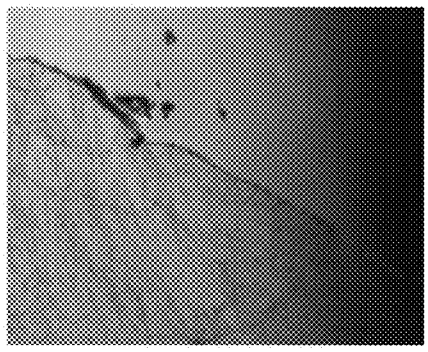
Figure 2D:
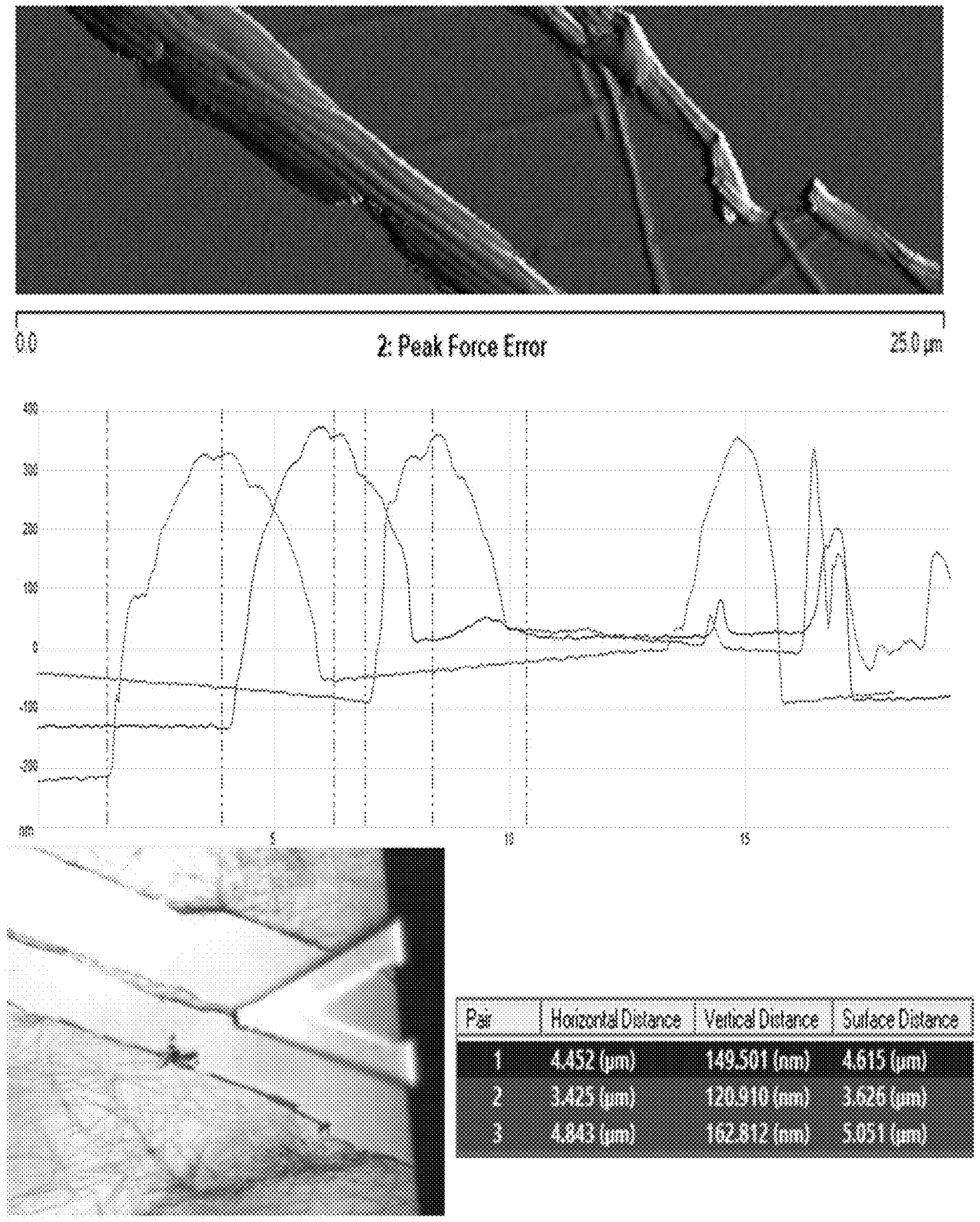
Figure 2E:
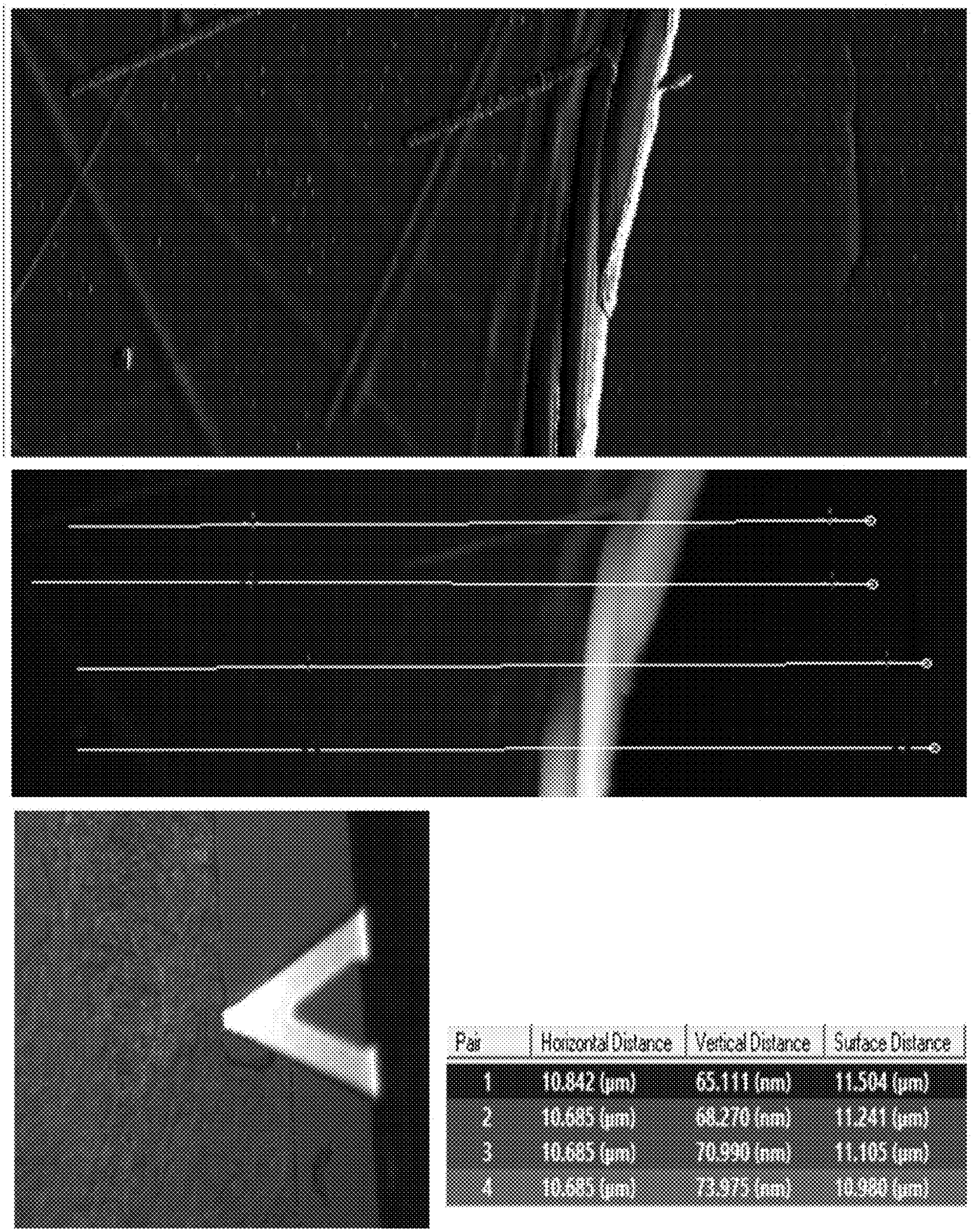

Referring now to FIGS. 2C, 2D and 2E, film thickness determination is shown through AFM measurements for 10%, 20% and 30% theoretical Ag NW loading, respectively. The average film thickness decreases from 349 nm to 144 nm to 57 nm with increasing Ag NW loading due to decreasing mixed solution viscosity while keeping spin coating parameters constant. In the topographical images, the Ag NWs (Ø120 nm) can be observed protruding out of the PVA matrix.

Electrical Properties

Figure 3:
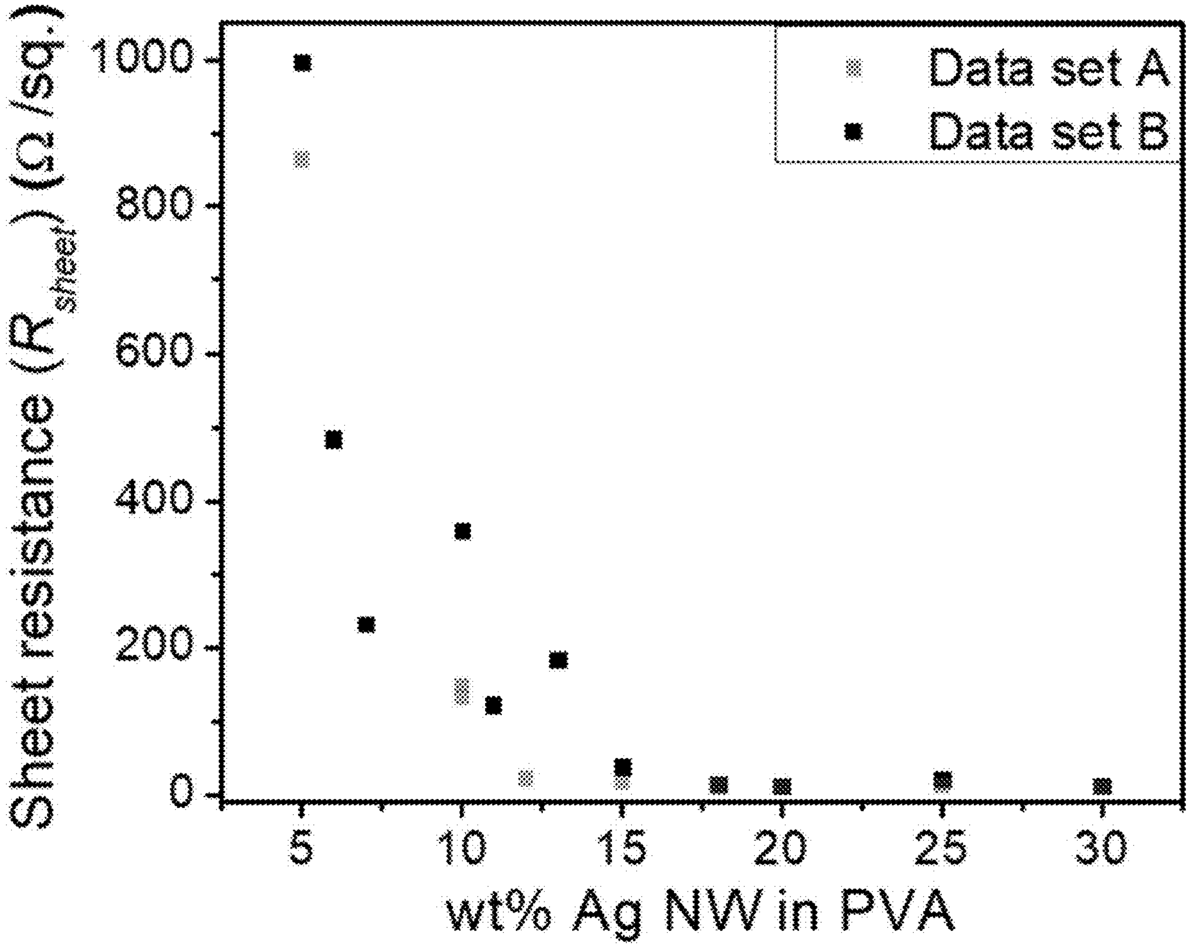
FIG. 3 depicts sheet resistance as a function of theoretical wt % Ag NW for Ag NW-PVA composite films deposited on 1×1 cm glass substrates. Determined through 4-probe van-der-Pauw method.

FIG. 3 is a graph of the sheet resistance of two sets of Ag NW-PVA composite films fabricated at different times with theoretical Ag NW loading in the range 5-30%. The sheet resistance decays following a power law function, $y=ax^{-k}$ with increasing Ag NW loading, and stabilizes around ~11 Ohm/sq above 15% Ag NW. This is comparable to other Ag NW-PVA reports in the literature. The stabilization of sheet resistance at higher loading indicates that a stable conductive network of Ag NW junctions has been established, as illustrated in FIG. 1A.

Comparing with traditional TCE materials; 80 nm FTO (on 1.1 mm glass) has a reported $R_{sheet}$ of 70-90 Ohm/sq while 50 nm ITO (on 1.1 mm glass) has an $R_{sheet} \leq 40$ Ohm/sq $R_{sheet}$ contributes to the contact resistance, $R_C$, and thus the series resistance, $R_S$, of a photodiode, a parameter one generally aims to minimize and ensure is lower than the shunt resistance, $R_{SH}$, in order to maximize the conversion efficiency. By increasing the oxide layer thickness, the sheet resistance of ITO and FTO can be decreased, although increased thickness has been shown to negatively affect the transmittance properties.

System

As discussed above, composite thin-films comprising Ag NWs in PVA are explored and show high (>70%) and tunable transmittance in the visible to the MWIR range and beyond, as well as tunable sheet resistance down to ~11 Ohm/sq. Film fabrication based on inexpensive, benign, and solution-processable precursors through a facile spin coating process at room temperature is demonstrated for a range of substrates. During post processing only mild annealing (~40 deg C.) and drying under vacuum is required, compatible with CQDs and substrates sensitive to elevated temperatures.

Given the aforementioned benefits such as tunable transmittance, Ag NW-PVA composite may be integrated as a top contact for vertical photodetectors operating in the SWIR and show comparable performance to similar photodetectors with thermally evaporated Ag top contacts. In one aspect of the invention, Ag NW-PVA composites may be used IR transparent top contacts for the further development of affordable and accessible IR imagers.

In various embodiments, a solution-based silver nanowire-polyvinyl alcohol (Ag NW-PVA) composite forming a transmissive and conductive thin-film can be used as a transparent electrode for optoelectronic devices. In various embodiments, colloidal quantum dot (CQD) infrared (IR) photodetectors may operate in the short-wave IR to the mid-wave IR region of the electromagnetic spectrum. In one embodiment, the Ag NW-PVA transparent electrode can also encapsulate and provide increased stability in ambient conditions for CQD IR photodetectors. The present invention may provide a solution-processable, transparent, and conductive top electrode for CQD-based midwave IR (MWIR) photodetectors compatible with an exemplary readout integrated circuit (ROIC) architecture that allows for IR imaging.

The present invention is associated with specific optical and electrical properties of an exemplary Ag NW-PVA composite with high transmittance throughout the MWIR coupled and with low and tunable sheet resistance, $R_{sheet}$. In one embodiment, the applicability of this Ag NW-PVA composite may be a top contact for a HgTe photodiode and show comparable photoresponse to a standard Ag metal top contact. This technology can thus be transferable to other CQD based vertical photodetector systems requiring a solution-processable, conductive, and highly transparent contacts.

Performance as Top Contact for an IR Photodetector

Figure 4A:
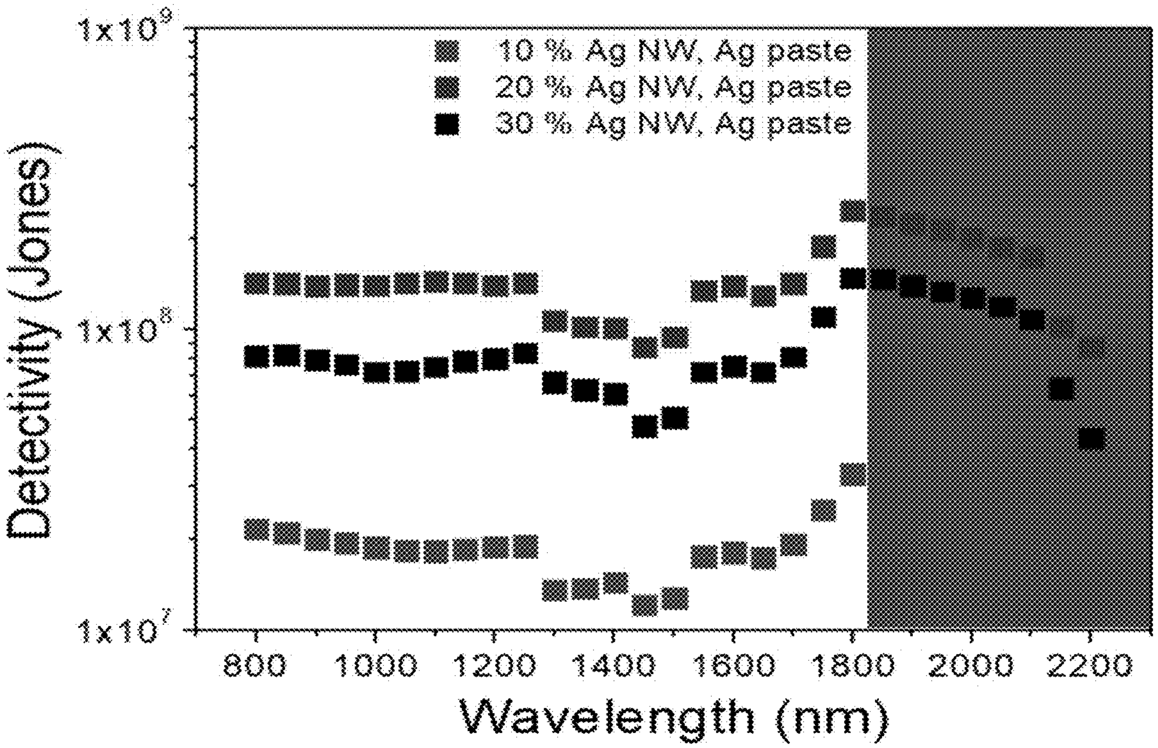
FIG. 4A depict specific detectivity at 25 Hz and 0V applied bias for vertical HgTe photodetectors with exemplary Ag NW-PVA or thermally evaporated Ag top contacts. For the values on red background, the input power has been estimated.
Figure 4A:
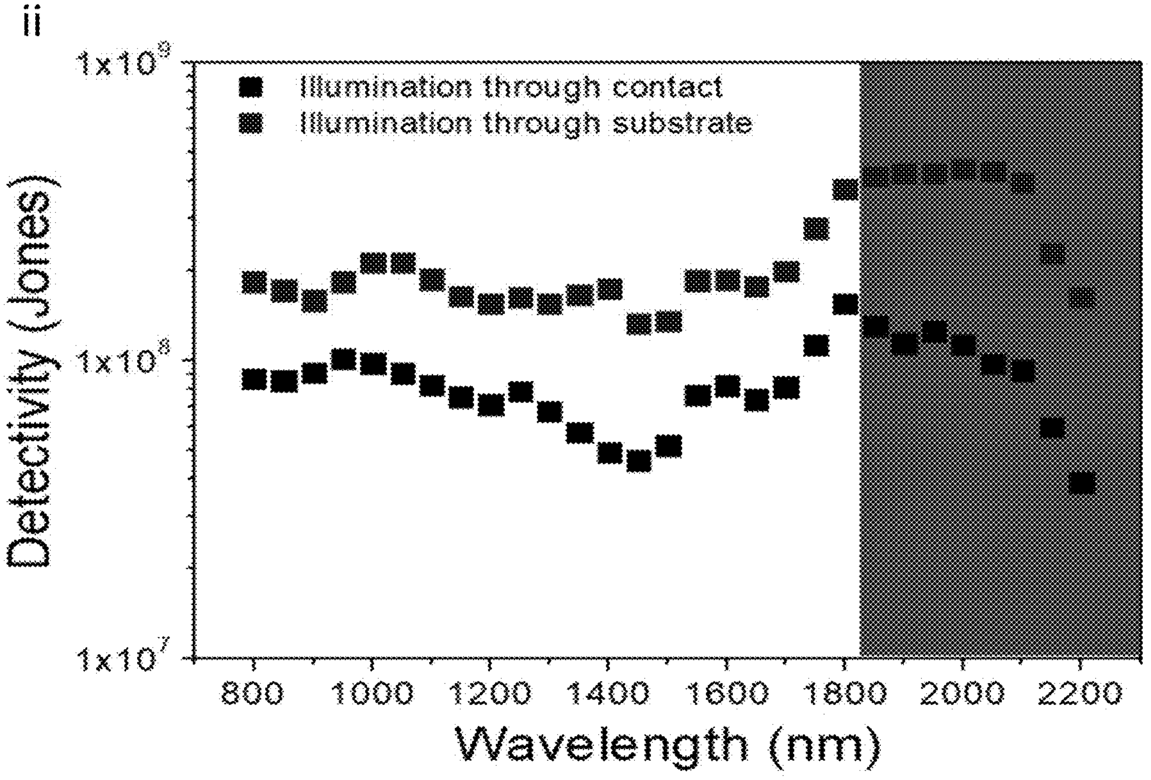
Figure 4B:
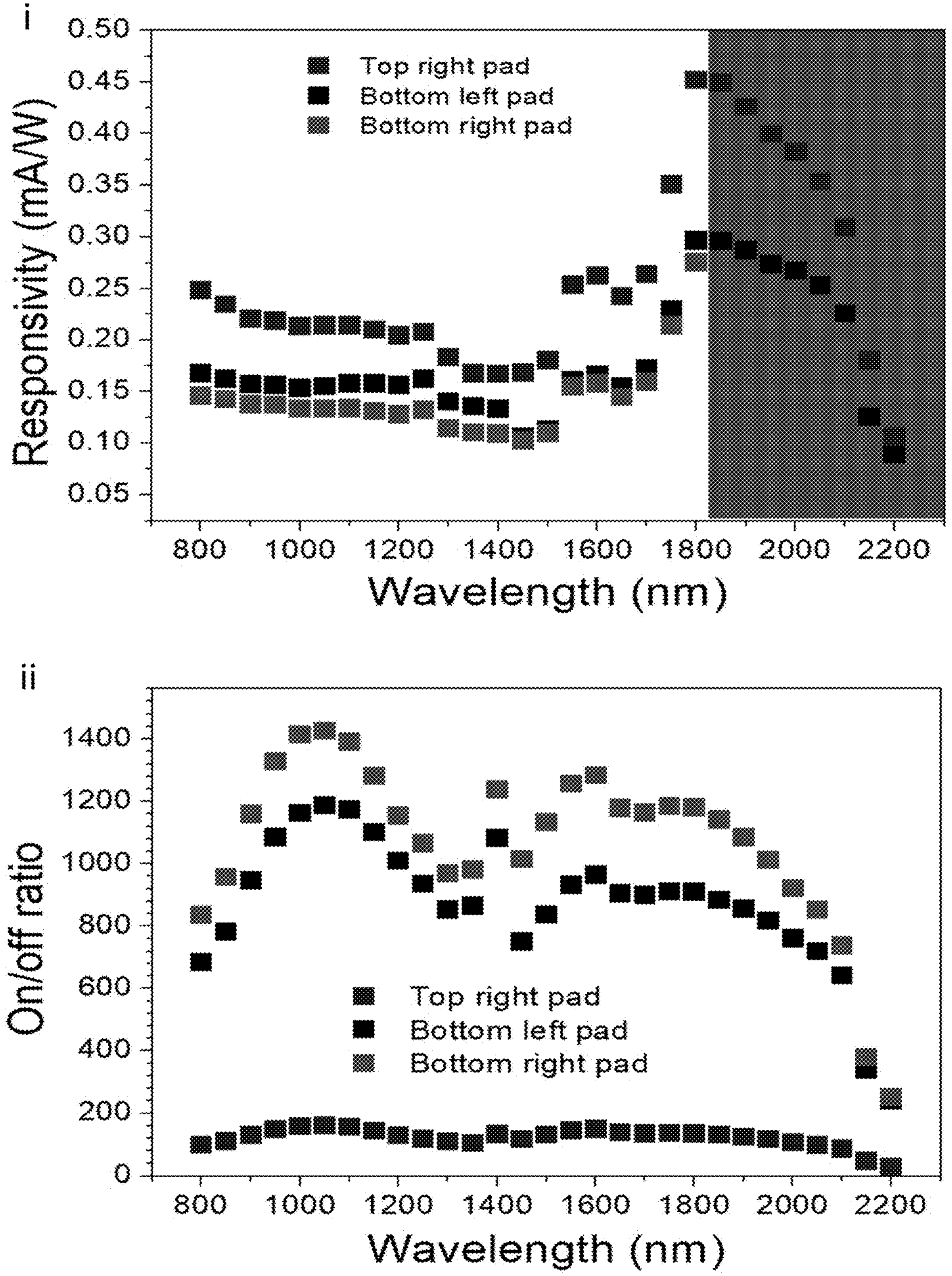
FIG. 4B depicts responsivity and on/off ratio at 0V applied bias for three HgTe CQD vertical devices with 20 wt % Ag NW-PVA composite top contact on day 1 after fabrication. Illumination through top contact.
Figure 4C:
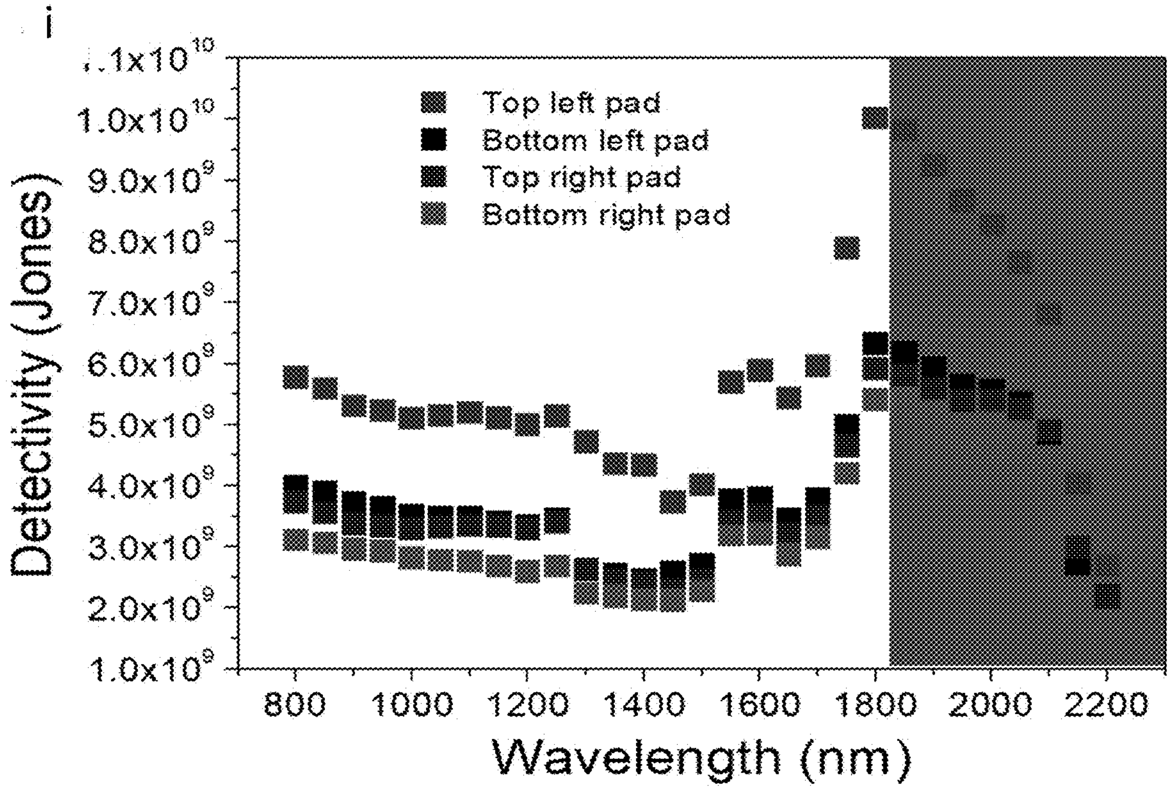
FIG. 4C compares specific detectivity (D*) with illumination through the top contact and through the substrate on day 6 after fabrication and demonstrates competitive performance when illuminated through the top contact. This indicates that the top contact is not the limiting factor in the disclosed devices. Responsivities, on/off ratios, noise current spectral density and device structure are shown in FIGS. 4D-4F.
Figure 4C:
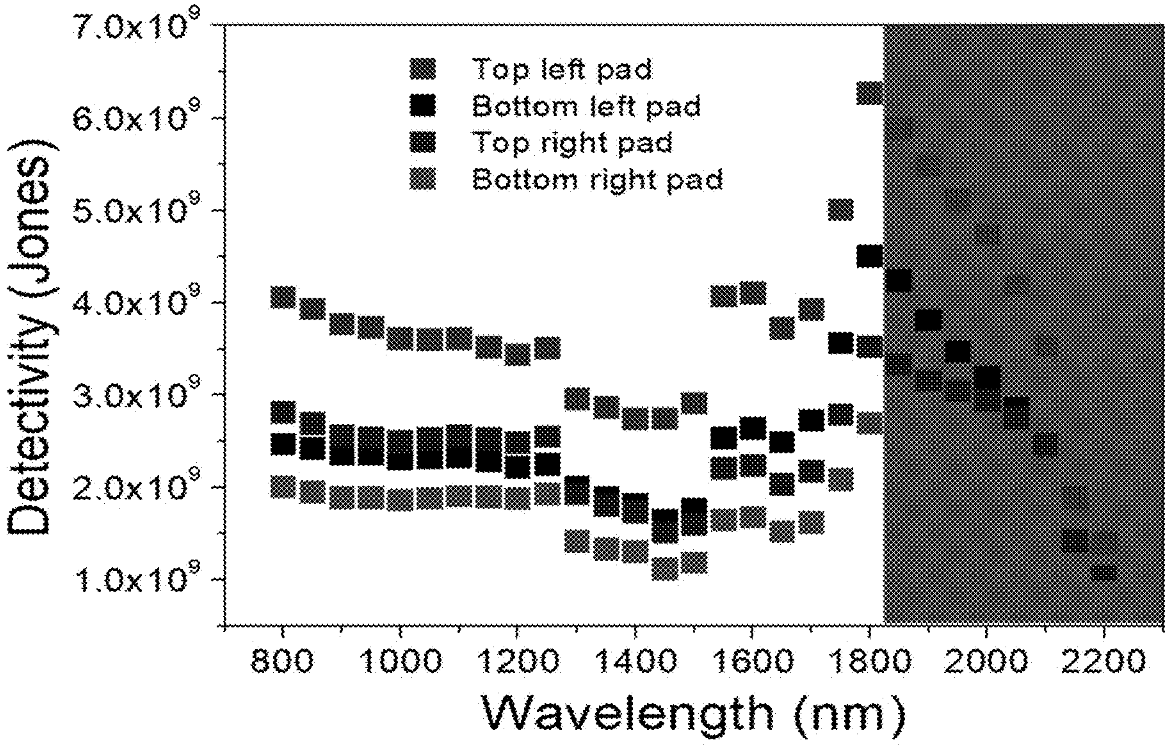
Figure 4D:
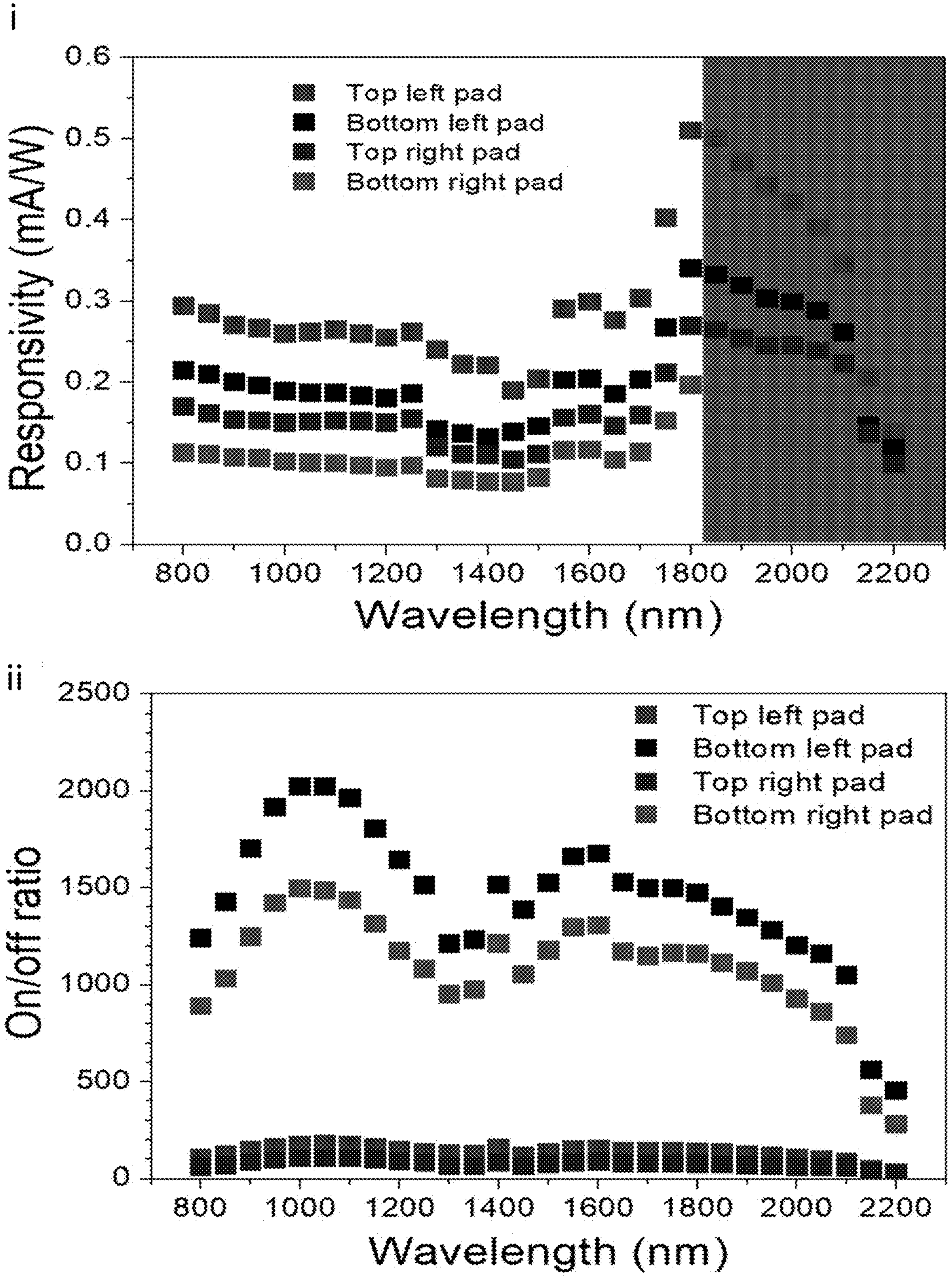
FIG. 4D depicts responsivities and on/off ratios at 0V applied bias for four HgTe CQD vertical devices with 20 wt % Ag NW-PVA composite top contact illuminated through the top contact on day 6 after fabrication. For the values on red background, the input power has been estimated.
Figure 4E:
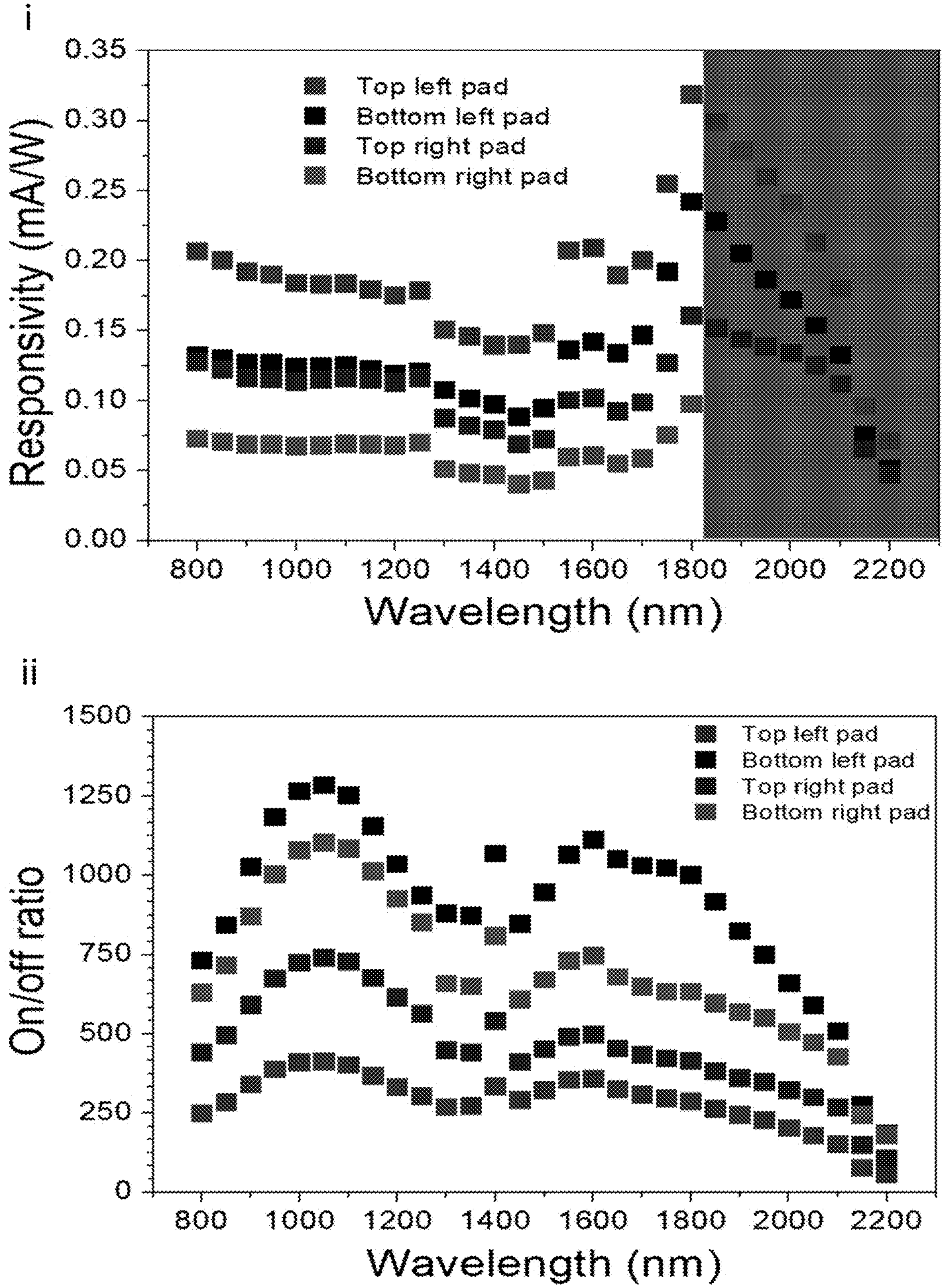
FIG. 4E depicts responsivities and on/off ratios at 0V applied bias for four HgTe CQD vertical devices with 20 wt % Ag NW-PVA composite top contact illuminated through the substrate on day 6 after fabrication. For the values on red background, the input power has been estimated.
Figure 4F:
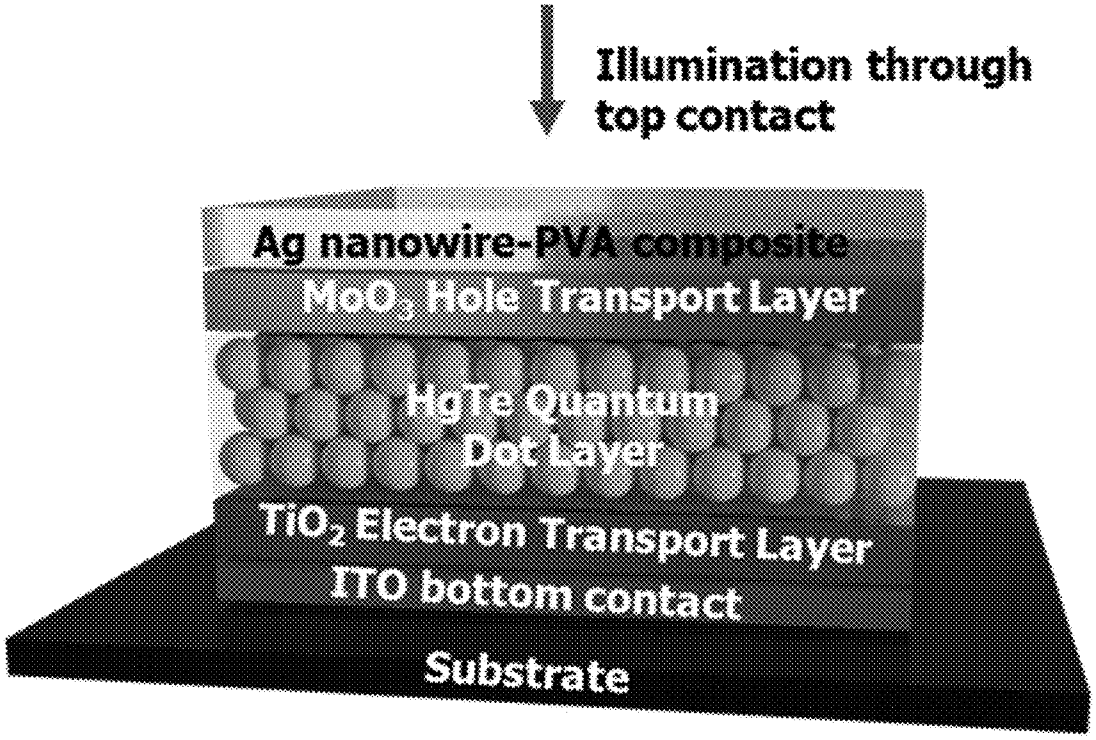
FIG. 4F depicts device structure and noise current spectral density.
Figure 4F:
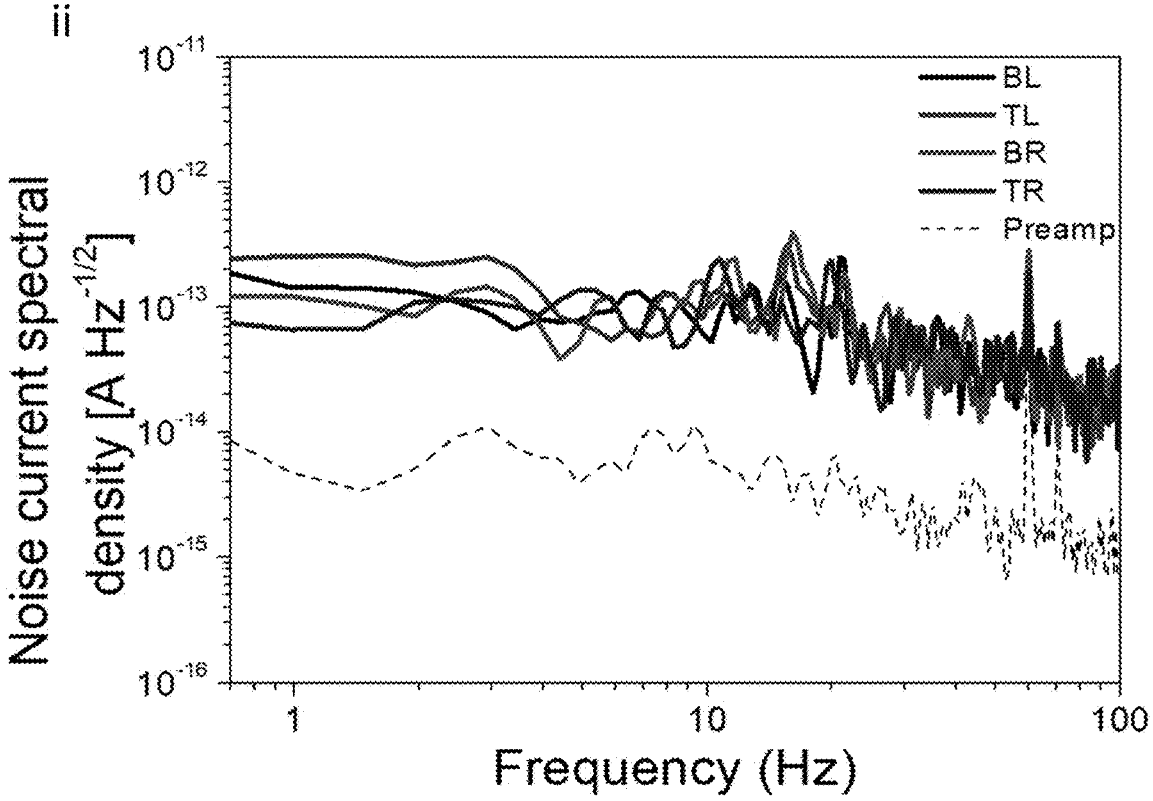

In some embodiments, the thin film may be a top contact for a photodiode. The photodiode may be a vertical HgTe photodiode or any other suitable photodiode known in the art. Referring now to FIG. 4A, the graphs show the specific detectivity, D*, of vertical HgTe CQD photodetectors with Ag NW-PVA composite top contacts with a twin sample having 100 nm thermally evaporated Ag top contact. All samples were characterized in ambient at room temperature at 25 Hz chopping frequency at 0V applied bias. D* was calculated as a function of wavelength based on Equation 1 below as discussed in Saran, R., et al., *Nature Photon* (2016). the entire disclosure of which, except for any definitions, disclaimers, disavowals, and inconsistencies, is incorporated herein by reference:

$$D*(\lambda) = \frac{R(\lambda)\sqrt{A}}{I_n} = \frac{i_{ph}(\lambda)}{P_{in}(\lambda)} x \frac{\sqrt{A}}{I_n} \quad \text{Equation 1}$$

where $R(\lambda)$ is the responsivity as a function of wavelength, $i_{ph}$ is the wavelength-dependent photocurrent, $P_{in}$ is the input power to the sample at a certain wavelength, A is the device area and $I_n$ is the noise current spectral density.

Figure 5A:
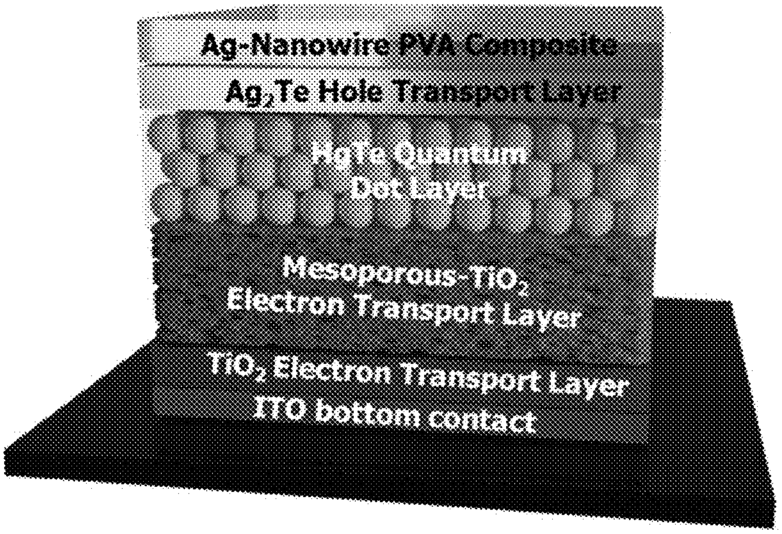
FIGS. 5A-5C show information related to Photodetector data.
Figure 5A:
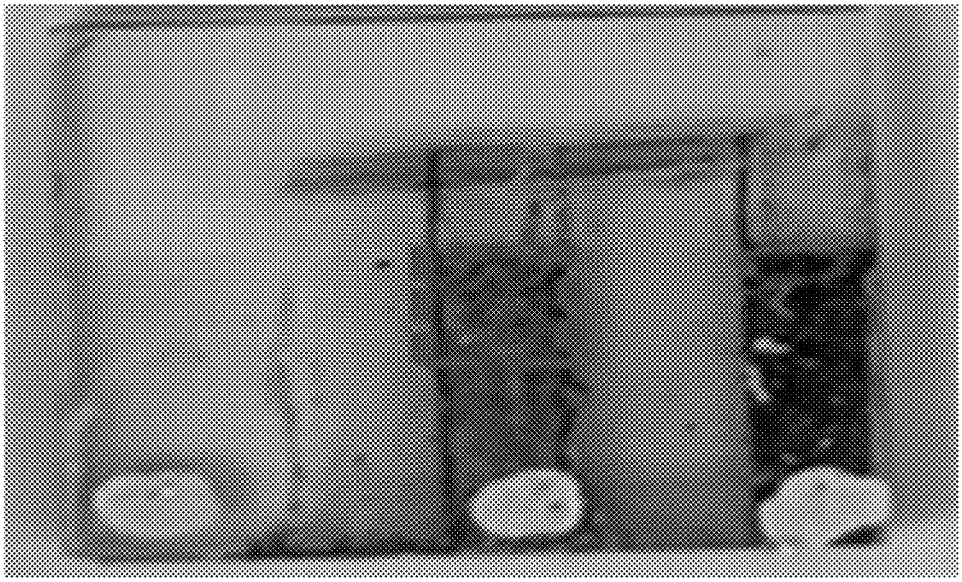
Figure 5A:
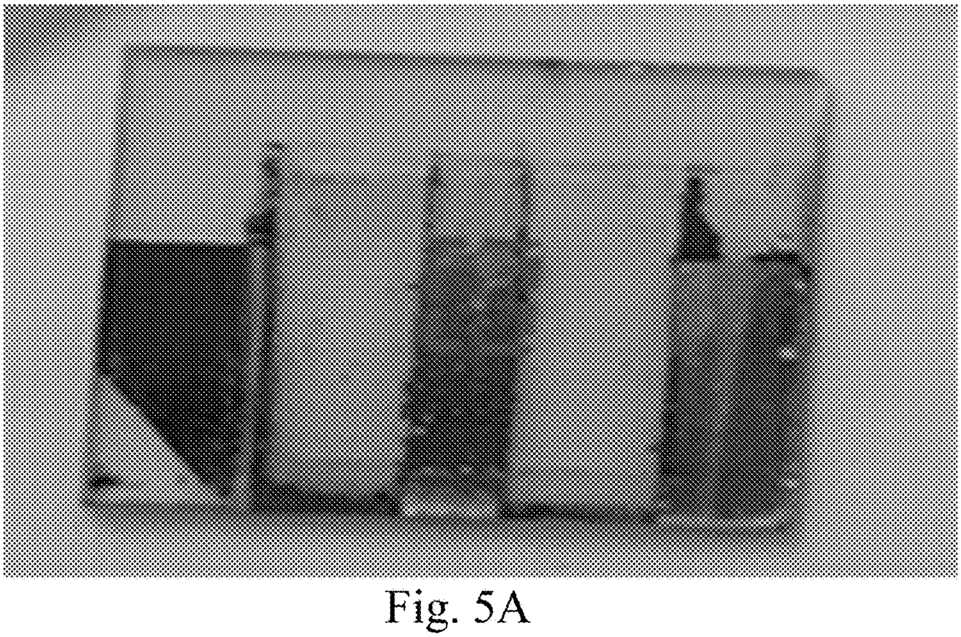

The complete device structure is found in FIG. 5A. The responsivity and noise values are found in FIGS. 5B and 5C.

Figure 5B:
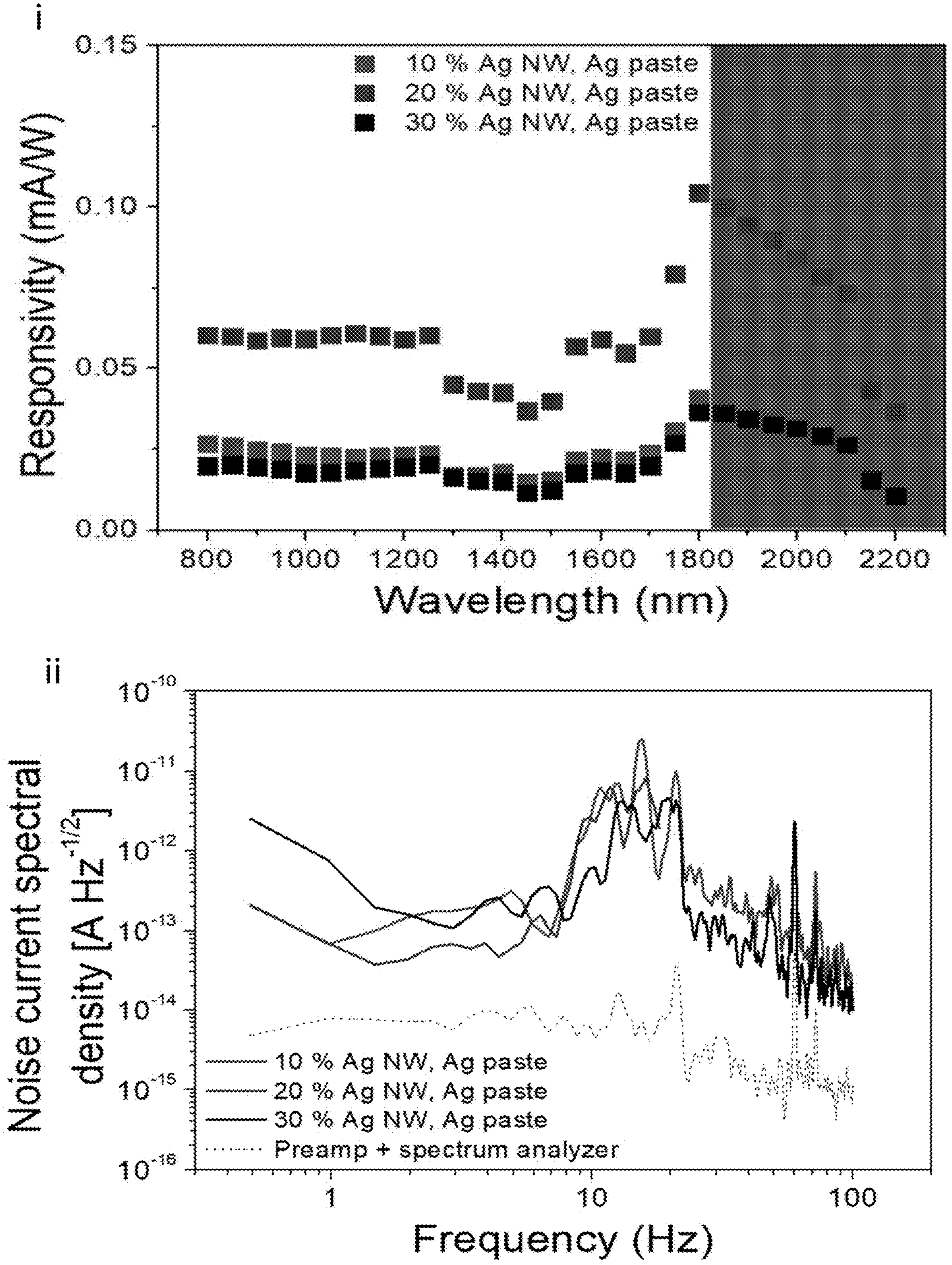
Figure 5C:
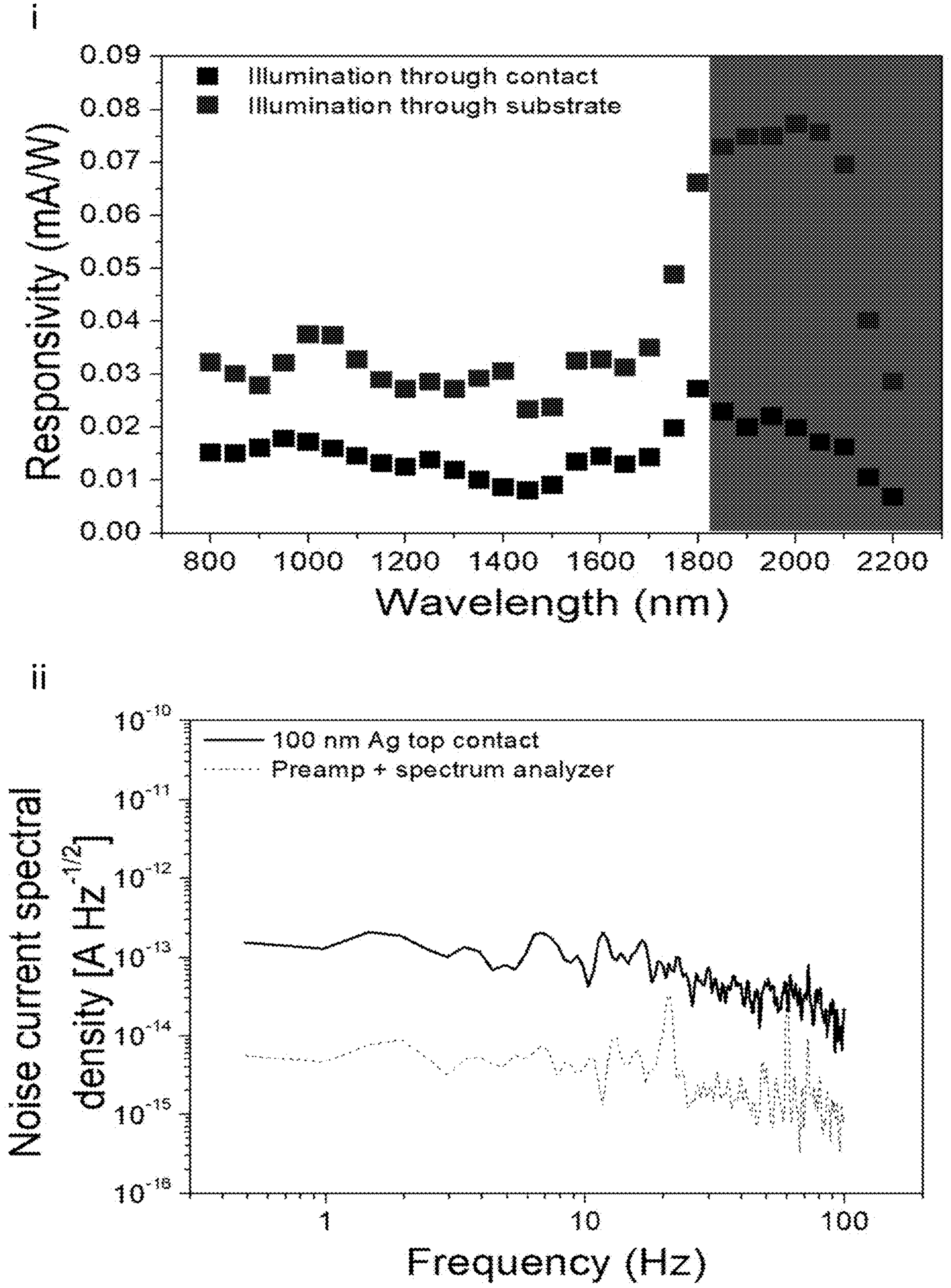
Figure 6:
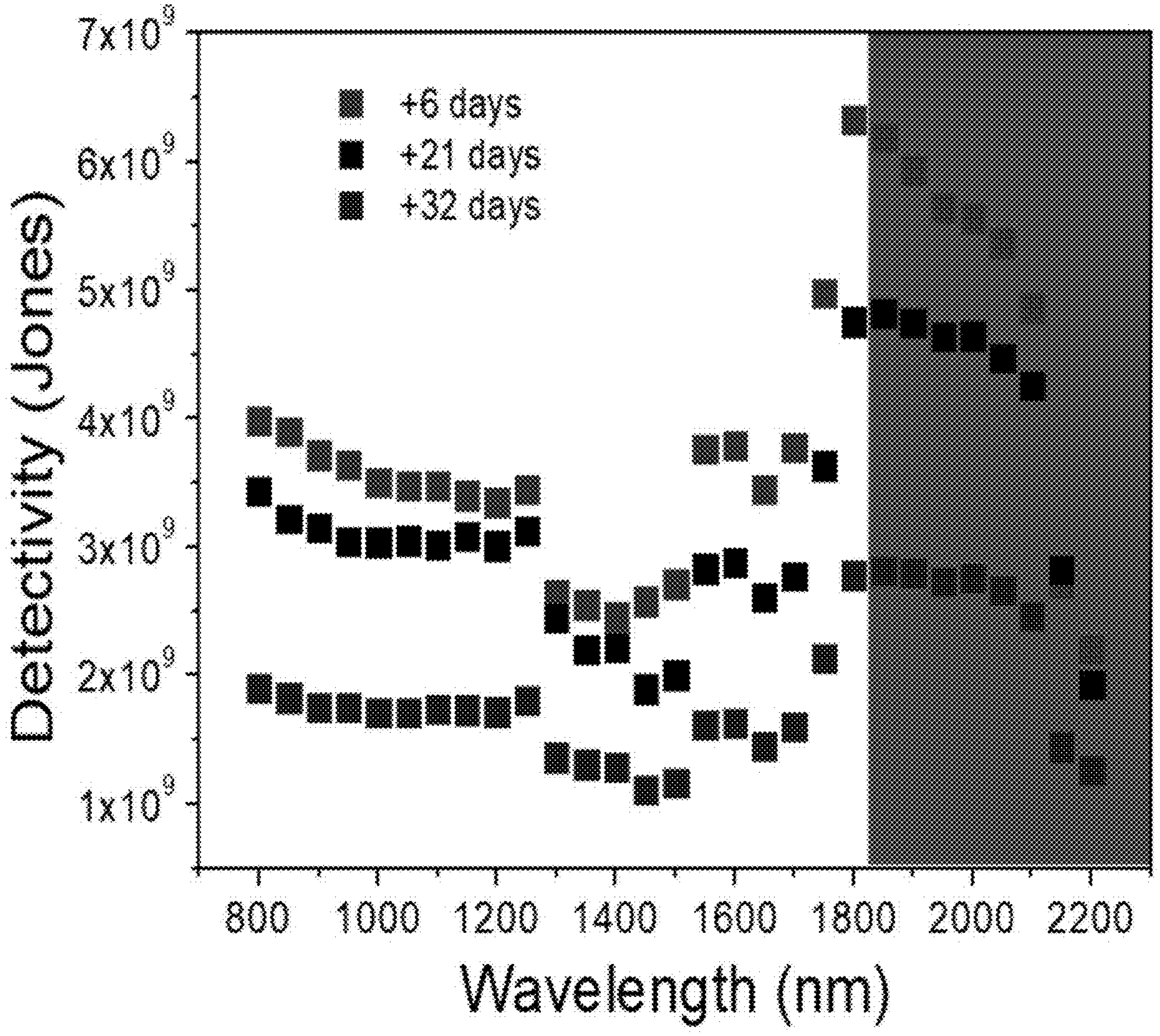
FIG. 6 depicts the performance of Gen2, 20% Ag NW, bottom left pad, over time.

Referring now to FIGS. 5B and 5C, responsivity data and noise current spectral density are shown for vertical photodetectors with Ag NW-PVA composite and thermally evaporated Ag top contacts at 0V applied bias, respectively Responsivity, $R(\lambda)$, was calculated according to Equation 2 below (Saran, R., Curry, R. Lead sulphide nanocrystal photodetector technologies. *Nature Photon* 10, 81-92 (2016)).

$$R(\lambda) = \frac{i_{ph}(\lambda)}{P_{in}(\lambda)} \quad \text{Equation 2}$$

where $i_{ph}$ is the wavelength-dependent photocurrent and $P_{in}$ is the input power to the sample at a certain wavelength.

Figure 4G:
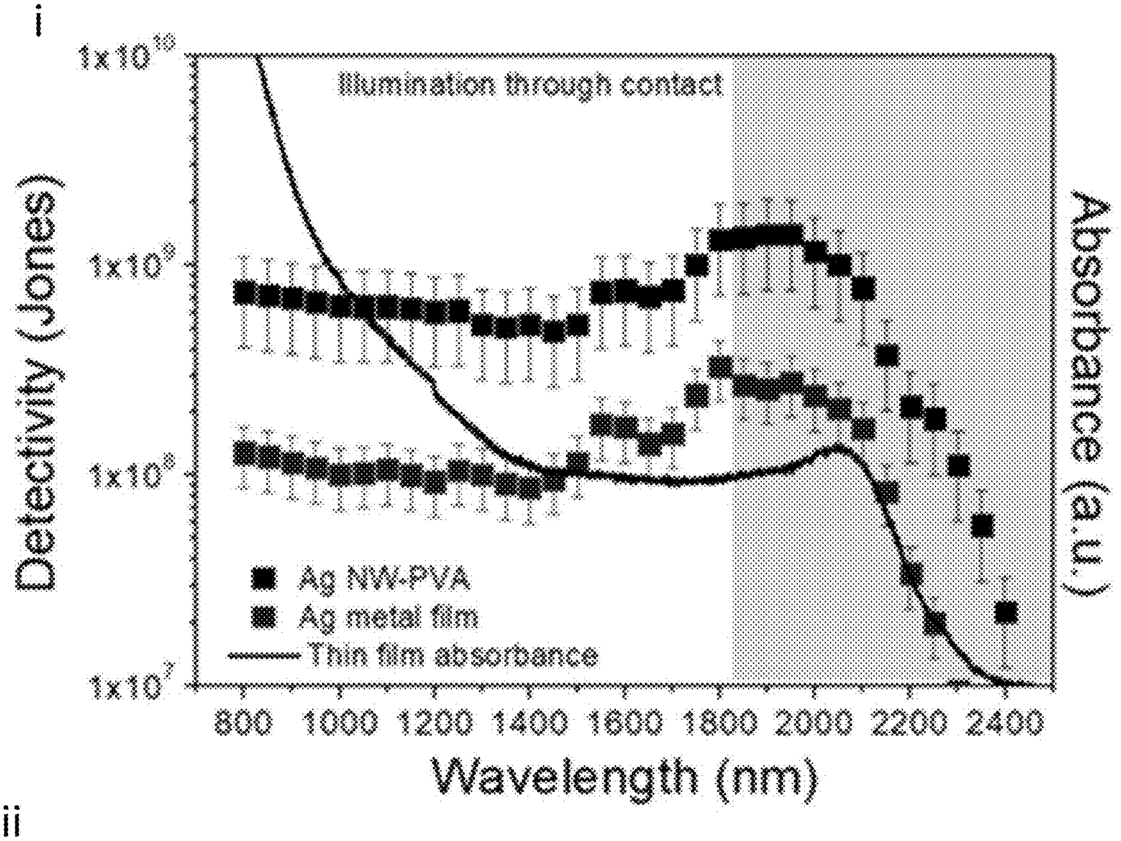
FIG. 4G (i) depicts specific detectivity at 25 Hz and 0V applied bias for twin vertical HgTe photodetectors with 20 wt % Ag NW-PVA (black squares) or thermally evaporated Ag top contacts (blue squares) illuminated through the top contact.
Figure 4G:
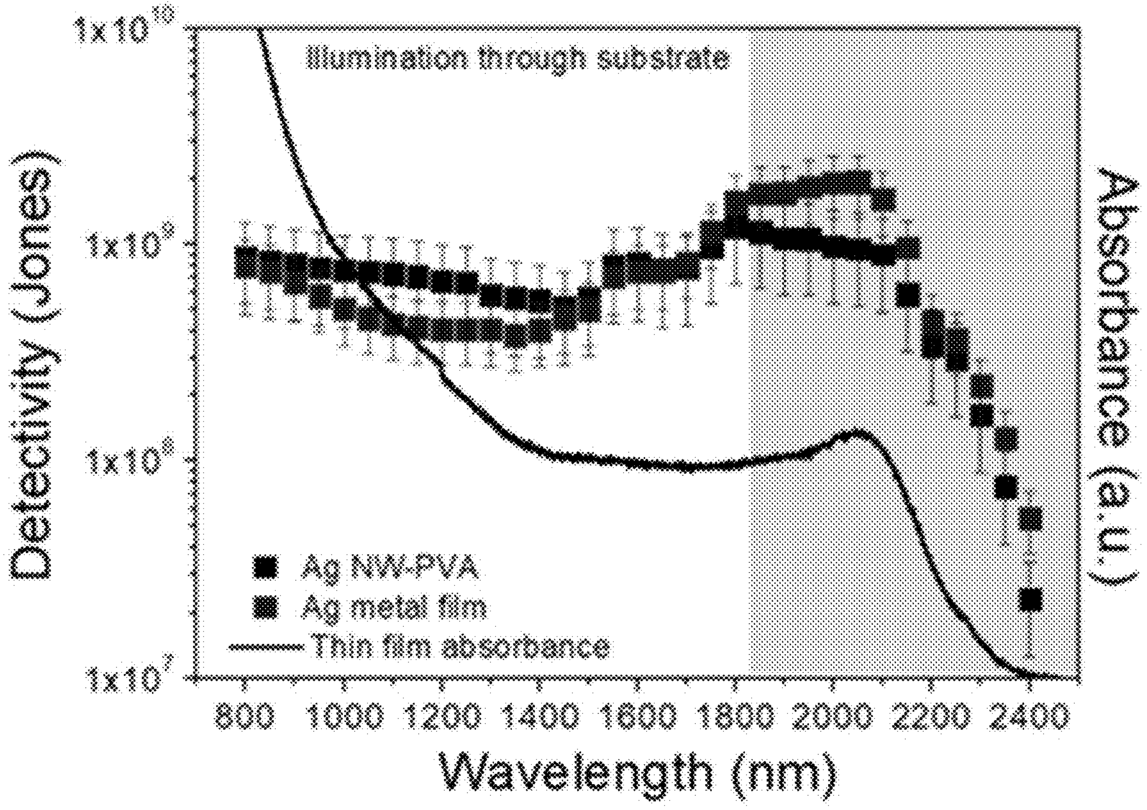

While a specific detectivity of ~$10^8$ Jones does not compete with state-of-the-art HgTe CQD IR photodetectors in the SWIR, the devices with Ag NW-PVA top contacts perform comparably to twin devices with thermally evaporated Ag (FIG. 4G), indicating that the top contact is not the limiting factor in the disclosed devices. This is an important result, as it points to direct transferability to optimized CQD based vertical photodetector systems requiring a top contact with low sheet resistance and high transmittance from the visible to the MWIR.

Figure 8A:
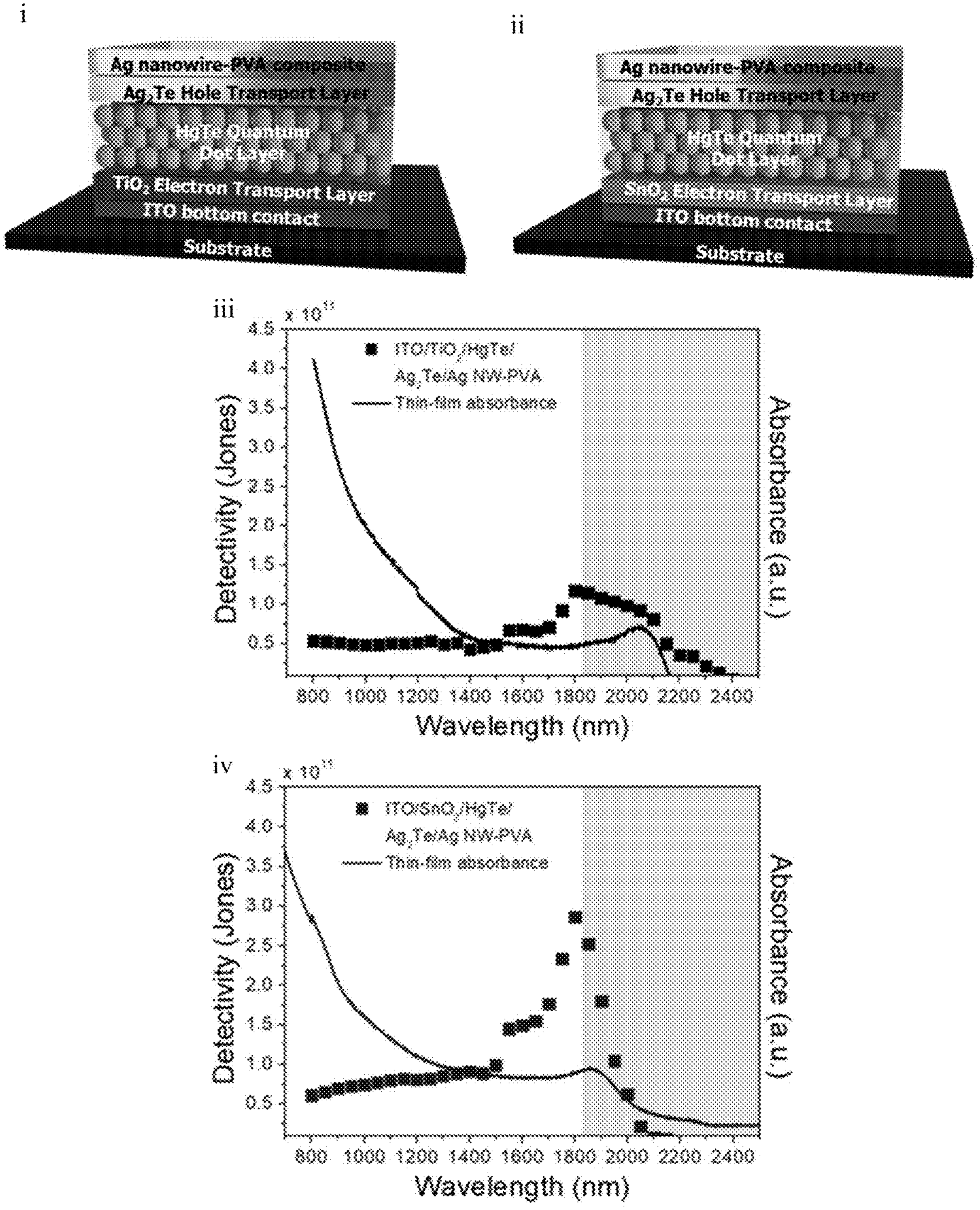
FIGS. 8A-8C depict exemplary device architectures and performance.

In order to push the performance of these SWIR devices further, the $MoO_3$ hole transport layer can be replaced with a silver selenide ($Ag_2Te$) CQD hole transport layer, achieving a peak specific detectivity of $1.2\times10^{11}$ Jones at 1800 nm, as depicted in FIG. 8A (iii). Current density-voltage (J-V) curves demonstrate diodic behavior, (FIG. 8C) with a leakage current of ~85 μA $cm^{-2}$ at 0.1 V reverse bias.

Figure 8B:
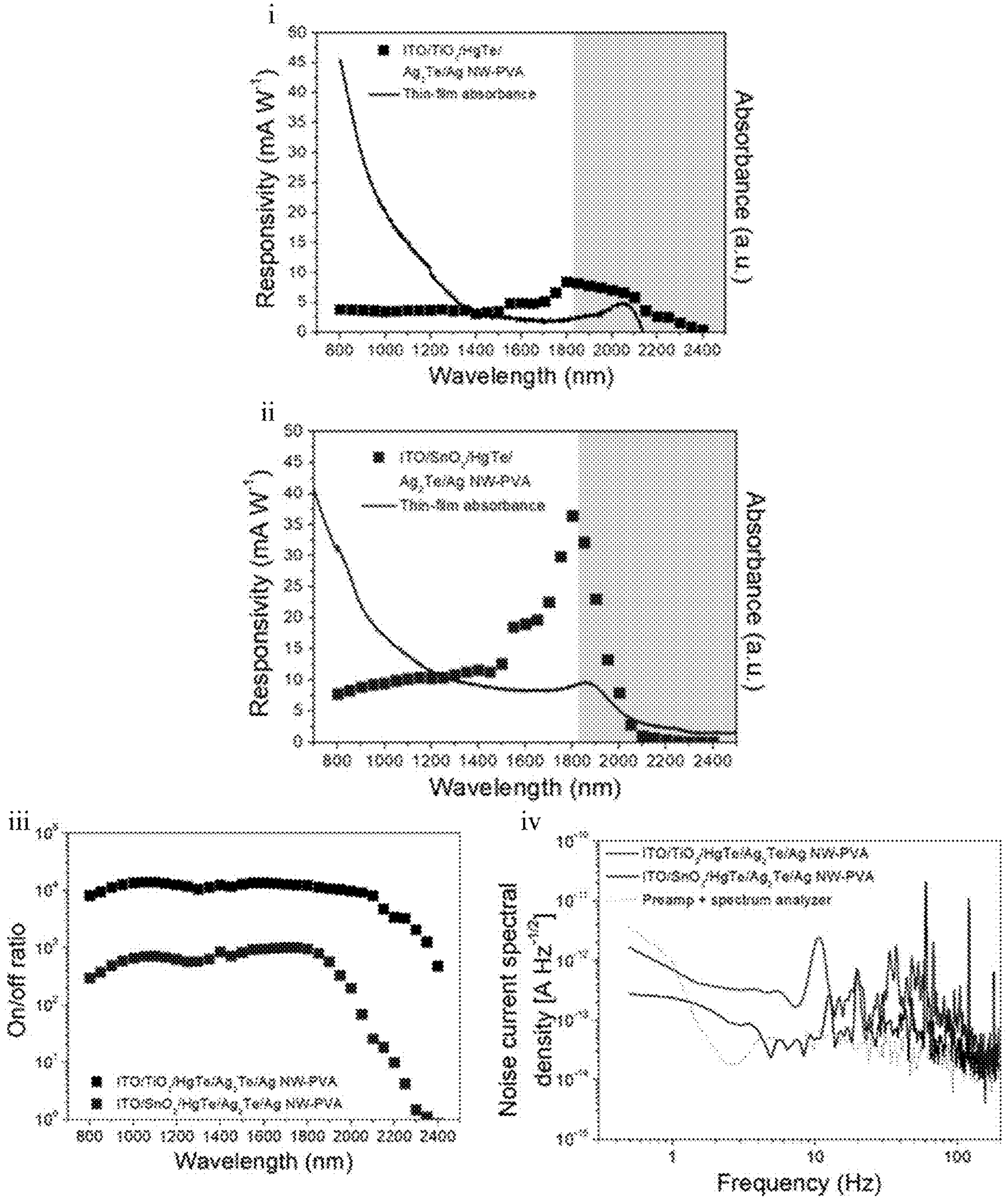
Figure 8C:
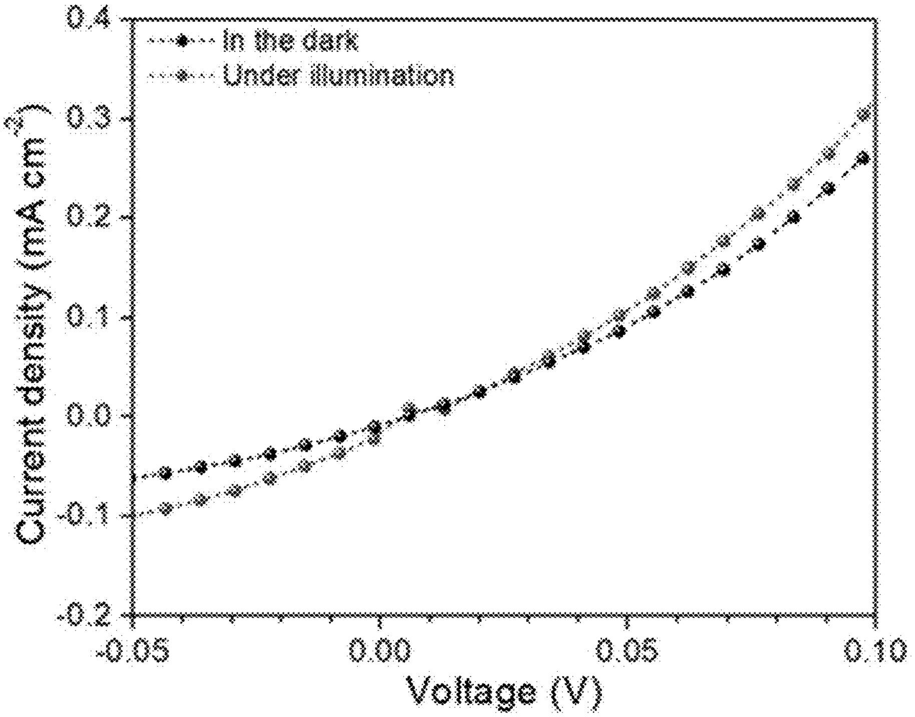
Figure 8C:
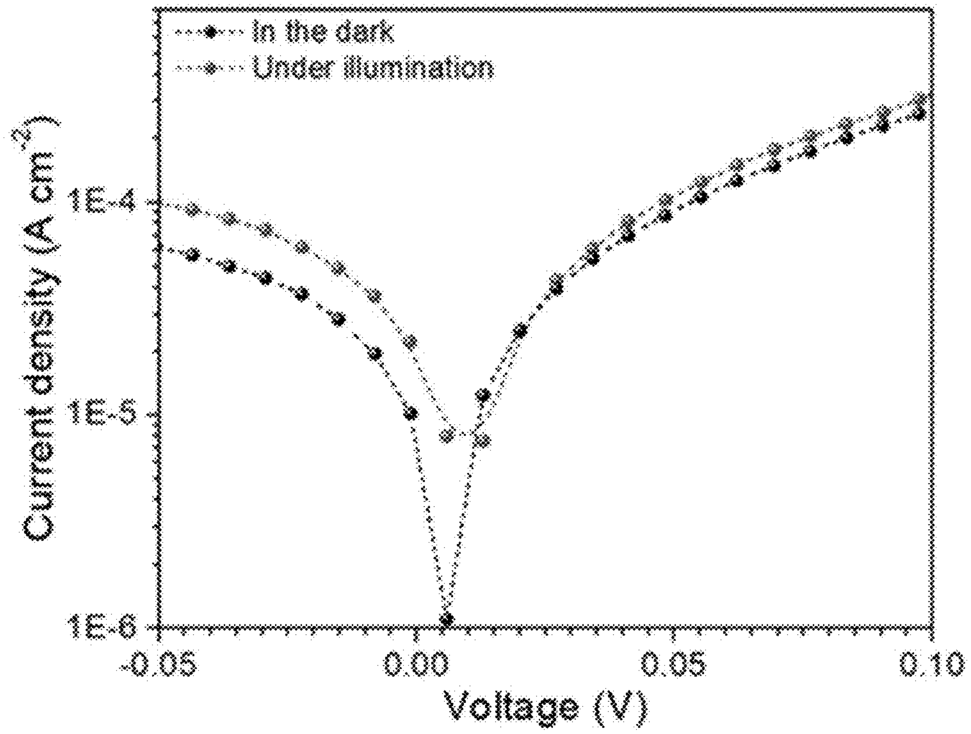
Figure 9:
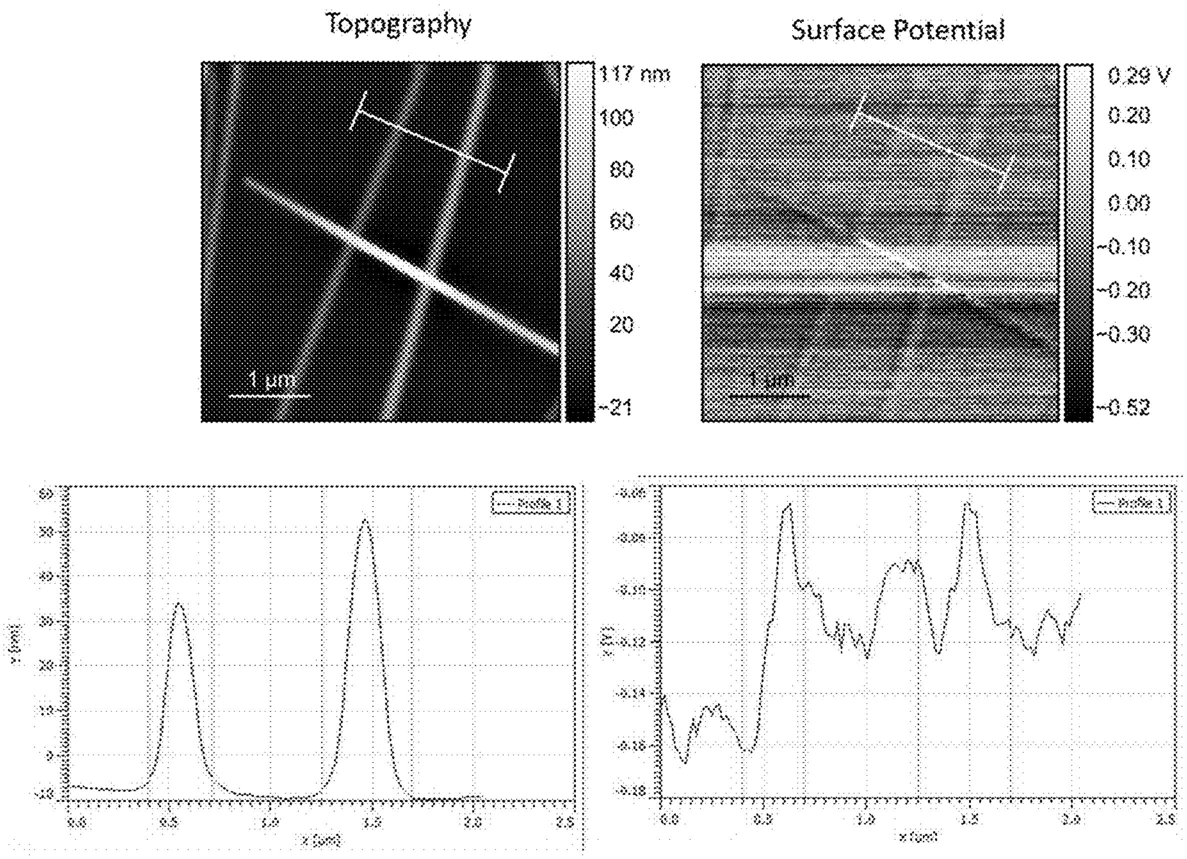
FIG. 9 depicts Kelvin Probe Force Microscopy (KPFM) measurements for estimation of the work function (φ) of the Ag NW-PVA composite electrode to 4.613 eV relative to vacuum. This result demonstrates that the Ag NW-PVA composite electrode provides a slightly higher driving force for hole transfer than indium tin oxide (ITO) and metallic silver, and a slightly lower driving force for hole transfer than fluorine doped tin oxide (FTO).

By replacing the $TiO_2$ electron transport layer with tin oxide ($SnO_2$), the performance can be improved further to a peak specific detectivity of ~$2.9\times10^{11}$ Jones (FIG. 8A (iv)) and a responsivity of ~36.5 mA $W^{-1}$ at 1800 nm (FIG. 8B (ii)). This optimized specific detectivity is on the same order of magnitude as the best performing SWIR HgTe CQD photodiodes operating at ~300 K, albeit with one order of magnitude lower responsivity.

EXPERIMENTAL EXAMPLES

The invention is further described in detail by reference to the following experimental examples. These examples are provided for purposes of illustration only, and are not intended to be limiting unless otherwise specified. Thus, the invention should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the system and method of the present invention. The following working examples therefore, specifically point out the exemplary embodiments of the present invention, and are not to be construed as limiting in any way the remainder of the disclosure.

Silver nanowires in isopropyl alcohol (Ag NWs in IPA, 20 mg/mL) were purchased from ACS Material LLC. Polyvinyl alcohol (PVA, 99+% hydrolyzed, MW 85,000-124,000) was purchased from Sigma-Aldrich. In-house deionized water (DI water) was utilized. The PVA was dissolved in DI water (typically 500 mg in 10 mL) under stirring and 115° C. heating overnight to form a ~5 wt % PVA stock solution. Ag NWs in IPA stock solution was added to the PVA stock solution at different ratios to form 10 wt %, 20 wt % and 30 wt % Ag NW in PVA solution. Specifically, 250 μL 5 wt % PVA in DI water was used as a base and 69 μL, 156 μL or 268 μL Ag NW in IPA stock solution was added for 10 wt %, 20 wt % and 30 wt % Ag NW, respectively. The Ag NW in IPA stock solution was mixed gently by manually tilting back and forth for several minutes before extracting the required volume, and the composite solutions were mixed in a similar manner.

A thin-film electrode was formed from the composite solution mixture by spin coating (static deposition, 4000 rpm for 60 sec) onto a desired substrate (e.g., a vertical photodiode sandwich structure) followed by annealing at 40 deg C. for 1 min and drying under vacuum for 12 hours.

Chemicals and Substrates:

Silver nanowires in isopropyl alcohol (Ag NWs in IPA, 20 mg/mL) were purchased from ACS Material LLC. Polyvinyl alcohol (PVA, 99+% hydrolyzed, Mw 85,000-124,000), tellurium (Te, granular, −5-+50 mesh, 99.99%), oleylamine (OlAm, technical grade, 70%), toluene ($C_6H_5CH_3$, anhydrous, 99.8%), 1-dodecanethiol (DDT, ≥98%), chlorobenzene ($C_6H_5Cl$, anhydrous, 99.8%), dimethyldidodecylammonium bromide (DDAB, 98%), trioctylphosphine (TOP, 97%), ethyl alcohol (EtOH, anhydrous, 200 proof, ≥99.5%), tetrachloroethylene (TCE, anhydrous, ≥99%), hexane ($C_6H_{14}$, anhydrous, 95%), 1,2-ethanedithiol (EDT, technical grade, ≥90%), hydrochloric acid (HCl, puriss. 24.5-26.0%), 2-propanol (IPA, anhydrous, 99.5%) and oleic acid (OA, 90%) were purchased from Sigma-Aldrich. Acetone ($CH_3COCH_3$, reagent grade), isopropyl alcohol ($C_3H_7OH$, reagent grade) and methanol ($CH_3OH$, reagent grade) were purchased from Greenfield Global Inc. Titanium oxide nanoparticles ($TiO_2$ NP, BL/SC & T600/SC grade) were purchased from Solaronix SA. Tin (IV) oxide nanoparticles ($SnO_2$ NP, 15% in aqueous colloidal dispersion) was purchased from Thermo Fisher Scientific Chemicals Inc. Mercury chloride ($HgCl_2$, >99.5%) and silver nitrate ($AgNO_3$, ≥99.0%) were purchased from ACS Reagents. In-house deionized water (DI water) was utilized. All chemicals were used as received without further purification.

0.2 mm thick, 9.5×9.5 mm glass substrates were purchased from Thin Film Devices. 0.5 mm thick, 100 mm diameter single-side polished silicon wafers having <100> orientation were purchased from University Wafer and cut into 10×10 mm substrates using a Disco DAD 3220 single spindle dicing saw. 1.1 mm thick, 15×15 mm glass substrates with 50 nm indium tin oxide (ITO) covering ⅔ of the substrate and 0.55 mm thick, 10×10 mm sapphire substrates were purchased from South China Science & Technology Company Limited. Before use, all substrates were cleaned by sonication in acetone, IPA and methanol (10 minutes in each) followed by 20 min plasma treatment in a PDC-001-HP Benchtop Plasma Cleaner from Harrick Plasma.

Composite Film Fabrication:

PVA was dissolved in DI water (typically 500 mg in 10 mL) under stirring and 115° C. heating overnight to form a ~5 wt % PVA stock solution. Ag NWs in IPA stock solution was added to the PVA stock solution at different ratios to form 10 wt %, 20 wt % and 30 wt % Ag NW in PVA solution. Specifically, 250 μL 5 wt % PVA in DI water was used as a base and 69 μL, 156 μL or 268 μL Ag NW in IPA stock solution were added for 10 wt %, 20 wt % and 30 wt % Ag NW, respectively. The Ag NW in IPA stock solution was mixed gently by tilting back and forth before extracting the required volume, and the composite solutions were mixed in a similar manner.

Ag NW-PVA composite films were deposited onto different substrates through spin coating (static or dynamic deposition, 4000 rpm for 60 sec) under ambient conditions. Thin-films were annealed on a hot plate at 40-44° C. for 1 min, followed by vacuum drying in a glovebox antechamber overnight.

HgTe Synthesis:

Livache, C., Martinez, B., Goubet, N. et al. disclosed a colloidal quantum dot infrared photodetector and its use for intraband detection. Nat Commun 10, 2125 (2019), the entire disclosure of which, except for any definitions, disclaimers, disavowals, and inconsistencies, is incorporated herein by reference.

The synthesis procedure was adapted from Livache (Nat Commun 10, 2125 (2019)). 171 mg $HgCl_2$ was added to 20 mL degassed oleylamine in a three-neck flask connected to a Schlenk line. The system was run through three cycles of vacuum-nitrogen ($N_2$) degassing at 110° C. for a total of ~90 min. The temperature was reduced to 80° C., and 0.63 mL of 1M TOP-Te diluted with 3.33 mL degassed oleylamine was injected. The particles were grown for 3 min before quenching with a mixture of 0.33 mL DDT and 3 mL toluene. An air gun aided in the cooling process. The crude solution was cleaned once with ethanol, centrifuged at 5000 rpm, resuspended in chloroform and stored until needed. Before use, the solution was cleaned twice again using the ethanol-chloroform and filtered through a 0.2 μm teflon (PTFE) syringe filter.

Sheet Resistance:

For sheet resistance measurements, Ag NW-PVA composite films were deposited onto cleaned glass substrates as described above, and Ag paste was applied to all four corners of the sample. Sheet resistance was measured using a home-built setup following a standard 4-probe van-der-Pauw method in an $N_2$-filled glovebox. Specifically, using Keithley 2400 source meters, voltages were measured upon applying currents between alternating pairs of contacts on the sample, and average horizontal and vertical resistances were calculated in a custom made Labview program. $R_{sheet}$ was reported following an iterative numerical calculation solving the van-der-Pauw formula.

UV-Vis Spectroscopy:

Ag NW-PVA composite samples were deposited onto cleaned glass substrates as described above. A Cary 5000 UV-Vis-NIR spectrophotometer from Agilent Technologies was used to measure the transmittance of the thin-film samples in air. A blank, clean glass substrate was used for background correction.

FTIR Spectroscopy:

Ag NW-PVA composite samples were deposited onto cleaned sapphire substrates as described above. A Nicolet 6700 FTIR was utilized to record the FTIR spectra of the thin-film samples in air, using a blank, clean sapphire substrate for background correction.

Scanning Electron Microscope (SEM):

Ag NW-PVA composite samples were deposited onto cleaned silicon substrates as described above. A Merlin (Carl Zeiss) Gemini Ultra-55 Analytical Field Emission Scanning Electron Microscope (FESEM) was used to image the samples at 3 V accelerating voltage and 4 mm working distance. ImageJ software was used to evaluate the image area covered by Ag NWs.

Atomic Force Microscope (AFM):

Ag NW-PVA composite samples were deposited onto cleaned glass substrates as described above. A Bruker Dimension Icon Atomic Force Microscope was used in ScanAsyst Air mode to measure film thickness and roughness. In this mode, the gain and frequency used during the measurement is modified by the software. A thin tweezer was used to scratch the film surface, and the AFM tip was run across the scratch at a resolution of 1024 scans/line. The film thickness was evaluated as the average difference between the height at substrate level and points on the film some distance away from the scratch to avoid ridge effects.

Kelvin Probe Force Microscopy (KPFM):

Ag NW-PVA composite samples were deposited onto clean 10×10 mm gold substrates using the same deposition and preparation protocols above. Work function measurements were performed with the Frequency-Modulated Kelvin Probe Force Microcopy (FM-KPFM) mode on the Bruker Multimode 8 Atomic Force Microscope (AFM) and by using silicon tip on silicon nitride cantilevers with resonance frequency of about 300 kHz and spring constant of about 0.8 N/m (Bruker PFQNE-AL). Silver paste was used to electrically connect the sample with a conductive disc. The topography and contact potential difference (CPD) images (4.5×4.5 $\mu m^2$, 256×256 pixels) were collected at a scan rate of 0.4 Hz. The work function of Ag nanowires was obtained from the CPD images. (=4.68 eV) was measured by performing FM-KPFM on gold calibration sample (Bruker PFKPFM-SMPL, =5.1 eV). CPD of any given sample was obtained from cross-section line profiles of 30-pixel thickness across the sample.

Thermogravimetric Analysis (TGA):

300 μL Ag NW stock solution or 250 μL 20% Ag NW in PVA mixed solution were dried in a clean, tared 80 μL platinum (Pt) pan at 85-122° C. for 20 min. Alternatively ~8 mg untreated PVA or ~0.08-0.15 mg spin coated and annealed 20% Ag NW in PVA film was placed dry in the Pt pan. The thermal response of the samples in the temperature range 25-600° C. was evaluated using a TGA550 Thermogravimetric Analyzer from TA Instruments with TRIOS software Version 5.4.0.300. Ramp rates were controlled between 10-20° C./min, and 10 min isothermal holds were performed at 110° C., (300-350° C.), and 600° C.

Figure 7A:
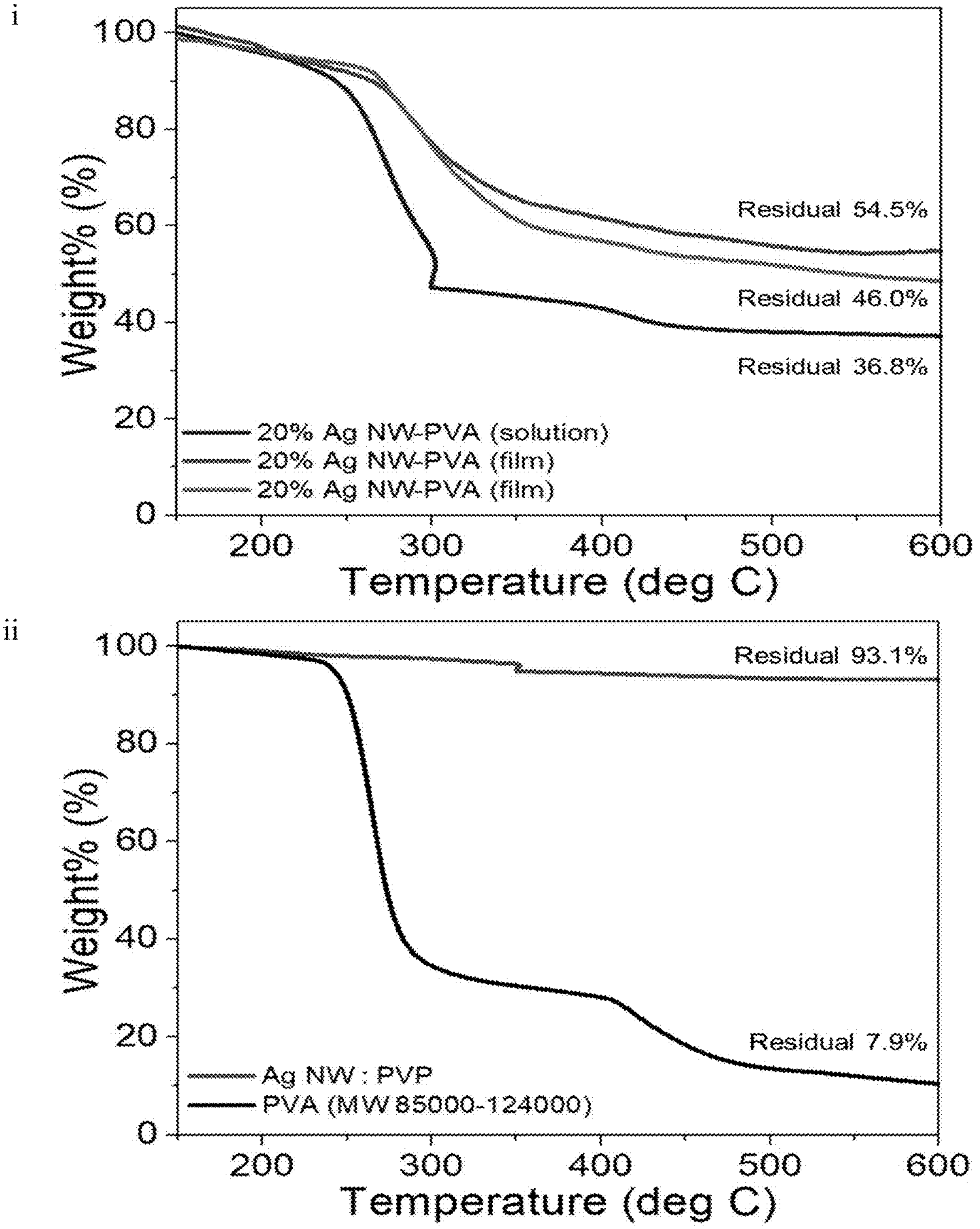
FIGS. 7A-7B depict experimental examples.

Thermogravimetric analysis (TGA) was used to determine the achieved Ag NW content in the Ag NW-PVA composite films. Referring now to FIG. 7A, graphs are shown of TGA spectra for Ag NW with polyvinylpyrrolidone (PVP) ligands based on the stock solution, pure PVA particles, as well as the 20% Ag NW in PVA mixed solution and film post vacuum treatment. The residual C content of PVA after air-free heat treatment approximately matches the PVP content in the Ag NWs. A higher residual Ag NW content than theoretically estimated was measured in the 20% Ag NW-PVA mixed solution. This could be due to higher Ag NW concentration or lower PVA concentration in the stock solutions. Due to the density difference between dissolved PVA and Ag NWs, an even higher residual mass was measured for the films than in the mixed solution, as a higher fraction of Ag NWs than PVA appears to stick to the substrate. Thus, the resulting films from 20% Ag NW-PVA mixed solution contain approximately ~50% Ag NW.

Device Fabrication:

Planar $TiO_2$ NP electron transport layer was deposited onto clean 15×15 mm glass-ITO substrates through spin coating of $TiO_2$ NP BL/SC stock solution in alcohols/water/organic binders (5000 rpm for 30 sec) in air. Two perpendicular edges of the fresh $TiO_2$ layer were wiped off using a cotton swab, exposing ~3 mm wide strips of ITO and ITO/glass, followed by annealing on a hot plate at 550° C. for 45 min. Then, a mesoporous $TiO_2$ NP layer was deposited from $TiO_2$ T600/SC stock solution through spin coating using the same parameters as above, followed by edge wiping and annealing on a hot plate at 475° C. for 60 min. The HgTe layers were deposited through dip coating of pairs of substrates using a custom-built dip coater. Specifically, the substrates were dipped at 100 mm/min into a 2-5 mg/mL HgTe CQD in toluene solution, dried for 8 sec, and then dipped at 150 mm/min into a 0.02 vol % EDT/IPA/HCl solution followed by a 150 mm/min dip into a neat IPA solution with a 12 sec drying period. This procedure was repeated 40 times. The substrates were then masked using polyimide (Kapton) tape, creating three exposed strips approximately 8 mm high and 2.5 mm wide. 15 nm $MoO_3$ was deposited onto the exposed areas through thermal evaporation in an $N_2$-filled glovebox. Finally, one out of each pair of dip coated samples received 100 nm thermally evaporated Ag top electrode, while Ag NW-PVA composite films with different Ag NW content were deposited through spin coating under ambient conditions onto the second sample from each pair. Static deposition was utilized and the pipette tip was used to spread the composite ink over the desired area. Then the sample was spun at 500 rpm for 10 sec, followed by 4000 rpm for 60 sec. The samples were annealed on a hot plate at 40-44° C. for 1 min and vacuum dried in a glove box antechamber overnight.

Photoresponse Measurements:

The photoresponse of the samples was characterized using a custom fabricated visible-to-SWIR photoconductivity setup. 300-3800 nm broadband light from an incoherent 250 W Oriel Newport Light source equipped with a halogen bulb was collimated, filtered for second order light and chopped at 25 Hz before being focused onto the input slit of a Cornerstone 260 Vis-NIR extended range ¼ m monochromator. Based on the selected monochromator wavelength, suitable high pass filters (375, 715 or 1400 nm) were selected. Maximum power output from the monochromator, while maintaining 39 nm resolution, was ensured through adjusting input and output slits to 3 mm. After collimation, the electromagnetic radiation exiting the monochromator was refocused onto the sample mounted in a dark enclosure. An 843-R-USB power meter coupled with a germanium (Ge) reference detector (818-ST2-IR) was utilized to quantify the wavelength-dependent input power hitting the sample. The generated photocurrent was amplified and converted to a voltage output through a Stanford Research Systems SR570 current preamplifier connected in series to a SR810 lock-in amplifier, allowing for extraction of the photovoltage signal from the light-exposed sample. No applied bias was necessary as these samples had a built-in bias enabling extraction of photogenerated carriers. Sample photovoltage and phase output from the lock-in amplifier were read and saved using a custom-built Lab View program. The preamplifier sensitivity setpoint enabled manual back-conversion of photovoltage to photocurrent for further photoresponse evaluation.

Noise Measurements:

Noise current spectral density was measured using an SR770 FFT Spectrum Analyzer. The samples were placed in an electromagnetically shielded dark box, and the signal was amplified through an SR570 current preamplifier at $10^{-10}$ A/V sensitivity setpoint in high bandwidth and battery mode. A 12 dB/oct low-pass filter at 1 kHz was employed, and 20× exponential averaging was activated for the output data. The noise value at 25 Hz at 0V applied bias was used to calculate the specific detectivity, D*.

Figure 7B:
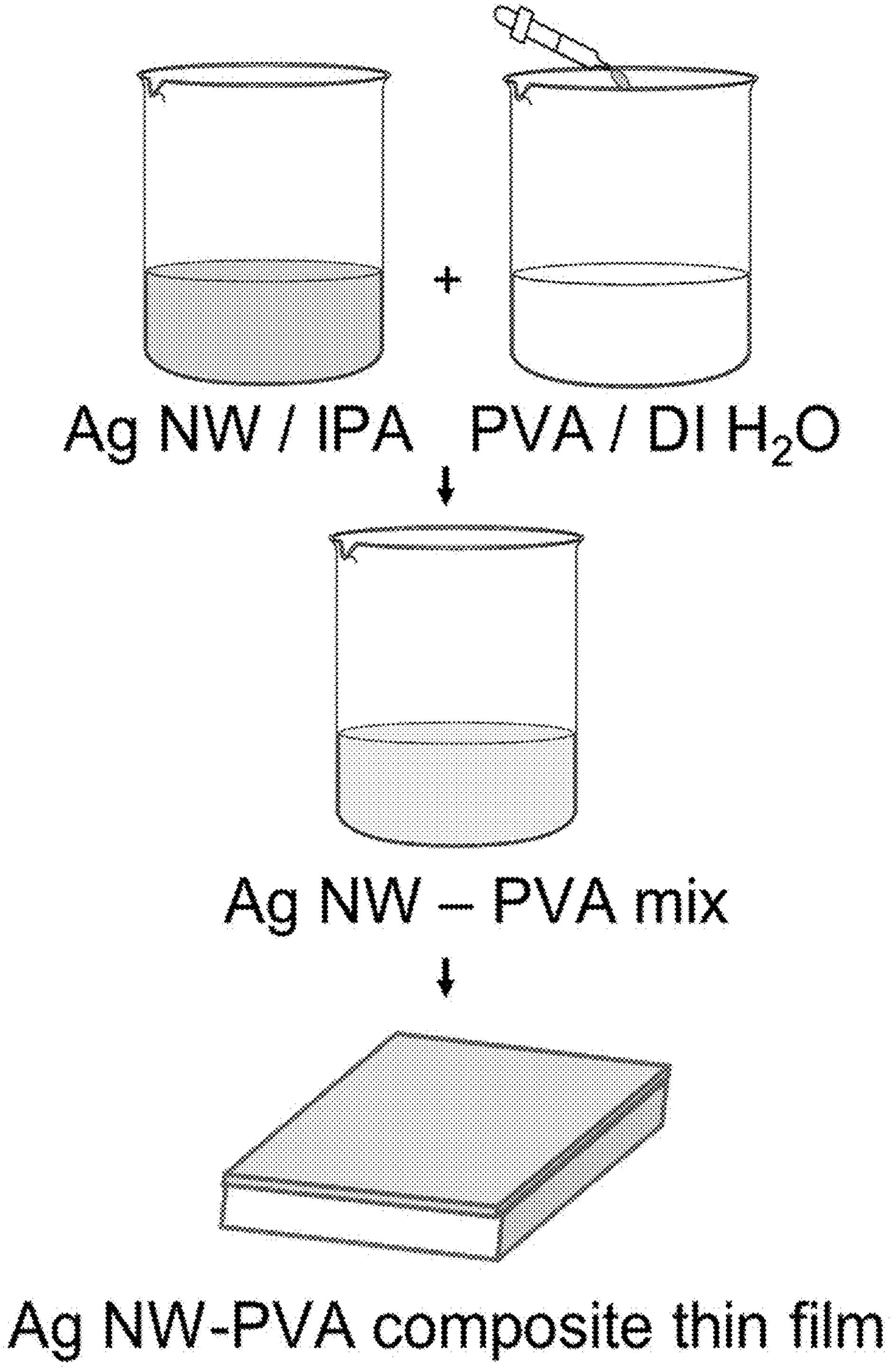

Ag NW-PVA composite films were fabricated as described above. Briefly, Ag NWs dispersed in IPA (20 mg/mL) were mixed with PVA dissolved in DI water (~5 wt %) at various ratios, and the mixed solutions were spin coated onto sonicated (acetone, IPA, methanol) and plasma treated substrates, as illustrated in FIG. 7B. After a brief 1 min drying step at ~40-44° C., the samples were further dried under vacuum for 12 hours.

The disclosures of each and every patent, patent application, and publication cited herein are hereby incorporated herein by reference in their entirety, except for any definitions, subject matter disclaimers or disavowals, and except to the extent that the incorporated material is inconsistent with the express disclosure herein, in which case the language in this disclosure controls.

REFERENCES

The following publications are each hereby incorporated herein by reference in their entirety:

A. Chatterjee, J. Balakrishnan, N. B. Pendyala, K. S. R. Koteswara Rao, Appl. Surf. Sci. Adv. 2020, 1, 100024. DOI 10.1016/j.apsadv.2020.100024

A. Chatterjee, N. B. Pendyala, A. Jagtap, K. S. R. K. Rao, e-J. Surf Sci. Nanotechnol. 2019, 17, 95. DOI 10.1380/ejssnt.2019.95

A. Chu, B. Martinez, S. Ferré, V. Noguier, C. Gréboval, C. Livache, J. Ou, Y. Prado, N. Casaretto, N. Goubet, H. Cruguel, L. Dudy, M. G. Silly, G. Vincent, E. Lhuillier, ACS Appl. Mater. Interfaces 2019, 11, 33116. DOI 10.1021/acsami.9b09954

A. J. Ciani, R. E. Pimpinella, C. H. Grein, P. Guyot-Sionnest, in Proc. SPIE 9819, Infrared Technology and Applications XLII (Eds: B. F. Andresen, G. F. Fulop, C. M. Hanson, P. R. Norton), SPIE, Baltimore, Maryland, 2016.

A. Jagtap, N. Goubet, C. Livache, A. Chu, B. Martinez, C. Gréboval, J. Qu, E. Dandeu, L. Becerra, N. Witkowski, S. Ithurria, F. Mathevet, M. G. Silly, B. Dubertret, E. Lhuillier, J. Phys. Chem. C 2018, 122, 14979. DOI 10.1021/acs.jpcc.8b03276

A. K. Jena, A. Kulkarni and T. Miyasaka, Chem. Rev. 2019, 119, 3036.
A. Kahn, Materials Horizons 2016, 3, 7. DOI 10.1039/C5MH00160A
A. Kumar, M. Kumar, M. S. Goyat, D. K. Avasthi, Mater. Today Commun. 2022, 33, 104433. DOI 10.1016/j.mtcomm.2022.104433
B. Demaurex, S. De Wolf, A. Descoeudres, Z. Charles Holman, C. Ballif, Appl. Phys. Lett. 2012, 101, 171604. DOI 10.1063/1.4764529
B. Martinez, J. Ramade, C. Livache, N. Goubet, A. Chu, C. Gréboval, J. Qu, W. L. Watkins, L. Becerra, E. Dandeu, J. L. Fave, C. Méthivier, E. Lacaze, E. Lhuillier, Adv. Opt. Mater. 2019, 7, 1900348. DOI 10.1002/adom.201900348
B. Wang, M. Yuan, J. Liu, Z. Zhang, J. Liu, J. Yang, L. Gao, J. Zhang, J. Tang, X. Lan, Nano Lett., https://doi.org/10.1021/acs.nanolett.4c02235
C. Buurma, R. E. Pimpinella, A. J. Ciani, J. S. Feldman, C. H. Grein, P. Guyot-Sionnest, in Proc. SPIE 9933, Optical Sensing, Imaging, and Photon Counting: Nanostructured Devices and Applications (Eds: M. Razeghi, D. S. Temple, G. J. Brown), SPIE, San Diego, California, 2016.
C. Gréboval, A. Chu, N. Goubet, C. Livache, S. Ithurria, E. Lhuillier, Chem. Rev. 2021, 121, 3627. DOI 10.1021/acs.chemrev.0c01120
C. Gréboval, D. Darson, V. Parahyba, R. Alchaar, C. Abadie, V. Noguier, S. Ferré, E. Izquierdo, A. Khalili, Y. Prado, P. Potet, E. Lhuillier, Nanoscale 2022, 14, 9359. DOI 10.1039/D2NR01313D
C. Gréboval, E. Izquierdo, C. Abadie, A. Khalili, M. Cavallo, A. Chu, T. H. Dang, H. Zhang, X. Lafosse, M. Rosticher, X. Z. Xu, A. Descamps-Mandine, A. Querghi, M. G. Silly, S. Ithurria, E. Lhuillier, ACS Appl. Nano Mater. 2022, 5, 8602. DOI 10.1021/acsanm.2c02103
C. Gréboval, U. N. Noumbe, A. Chu, Y. Prado, A. Khalili, C. Dabard, T. H. Dang, S. Colis, J. Chaste, A. Ouerghi, J.-F. Dayen, E. Lhuillier, Appl. Phys. Lett. 2020, 117. DOI 10.1063/5.0032622
C. L. Tan, H. Mohseni, Nanophotonics 2018, 7, 169. DOI 10.1515/nanoph-2017-0061
C. Lee, J. Y. Kim, S. Bae, K. S. Kim, B. H. Hong, E. J. Choi, Appl. Phys. Lett. 2011, 98,
071905. DOI 10.1063/1.3555425
C. Livache, B. Martinez, N. Goubet, C. Gréboval, J. Qu, A. Chu, S. Royer, S. Ithurria, M. G. Silly, B. Dubertret, E. Lhuillier, Nat. Commun. 2019, 10, 2125. DOI 10.1038/s41467-019-10170-8
C.-C. Lin, D.-Y. Wang, K.-H. Tu, Y.-T. Jiang, M.-H. Hsieh, C.-C. Chen, C.-W. Chen, Appl. Phys. Lett. 2011, 98, 263509. DOI 10.1063/1.3605682
E. Aydin, C. Altinkaya, Y. Smirnov, M. A. Yaqin, K. P. S. Zanoni, A. Paliwal, Y. Firdaus, T. G. Allen, T. D. Anthopoulos, H. J. Bolink, M. Morales-Masis, S. De Wolf, Matter 2021, 4, 3549. DOI 10.1016/j.matt.2021.09.021
F. G. Micallef, P. K. Shrestha, D. Chu, K. McEwan, G. Rughoobur, T. Carey, N. Coburn, F. Torrisi, O. Txoperena, A. Zurutuza, Thin Solid Films 2018, 660, 411. DOI 10.1016/j.tsf.2018.05.037
F. Lavini, A. Calò, Y. Gao, E. Albisetti, T.-D. Li, T. Cao, G. Li, L. Cao, C. Aruta, E. Riedo, Nanoscale 2018, 10, 8304. DOI 10.1039/C8NR00238J
F. P. García de Arquer, A. Armin, P. Meredith, E. H. Sargent, Nat. Rev. Mater. 2017, 2, 16100. DOI 10.1038/natrevmats.2016.100
F. P. García de Arquer, D. V. Talapin, V. I. Klimov, Y. Arakawa, M. Bayer, E. H. Sargent, Science 2021, 373, eaaz8541. DOI 10.1126/science.aaz8541
G. Li, J. Zhao, Z. Wang, X. Yu, T. Zhao, X. Liang, R. Sun, L. Cao, P. Zhu, Mater. Lett. 2022, 325, 132814. DOI 10.1016/j.matlet.2022.132814
H. H. Ku, J. Res. Natl. Bur. Stand. C Eng. Inst. 1966, 70C, 263. DOI 10.6028/jres.070C.025
H. Lu, G. M. Carroll, N. R. Neale, M. C. Beard, ACS Nano 2019, 13, 939. DOI 10.1021/acsnano.8b09815
H. Lu, J. Luo, Y. Liu, Y. Zhong, J. Wang, Y. Zhang, IEEE J. Photovolt. 2019, 9, 710. DOI 10.1109/JPHOTOV.2019.2899469
J. C. Peterson, P. Guyot-Sionnest, ACS Appl. Mater. Interfaces 2023, 15, 19163. DOI 10.1021/acsami.3c00487
J. Kim, E. K. Ampadu, W. J. Choi, E. Oh, Nanotechnology 2019, 30, 075201. DOI 10.1088/1361-6528/aaf194
J. Meng, J. A. Rohr, H. Wang, B. E. Sartor, D. Song, A. Katzenberg, M. A. Modestino, Z. Xu, J. Kong and A. D. Taylor, Solar RRL 2022, 6, 2100794.
J. Ouyang, N. Graddage, J. Lu, Y. Zhong, T.-Y. Chu, Y. Zhang, Z. Wu, O. Kodra, Z. Li, Y. Tao, J. Ding, ACS Appl. Nano Mater. 2021, 4, 13587. DOI 10.1021/acsanm.1c03030
J. Qu, N. Goubet, C. Livache, B. Martinez, D. Amelot, C. Gréboval, A. Chu, J. Ramade, H. Cruguel, S. Ithurria, M. G. Silly, E. Lhuillier, J. Phys. Chem. C 2018, 122, 18161. DOI 10.1021/acs.jpcc.8b05699
J. Yang, H. Hu, Y. Lv, M. Yuan, B. Wang, Z. He, S. Chen, Y. Wang, Z. Hu, M. Yu, X. Zhang, J. He, J. Zhang, H. Liu, H.-Y. Hsu, J. Tang, H. Song, X. Lan, Nano Lett. 2022, 22, 3465. DOI 10.1021/acs.nanolett.2c00950
J. Yang, Y. Lv, Z. He, B. Wang, S. Chen, F. Xiao, H. Hu, M. Yu, H. Liu, X. Lan, H.-Y. Hsu, H. Song, J. Tang, ACS Photonics 2023, 10, 2226. DOI 10.1021/acsphotonics.2c01145
K. A. Son, D. Wong, H. Sharifi, H. C. Seo, T. D. Lyon, S. Terterian, J. S. Moon, T. Hussain, IEEE Trans. Nanotechnol. 2015, 14, 10. DOI 10.1109/TNANO.2014.2366475
L. Hu, H. S. Kim, J.-Y. Lee, P. Peumans, Y. Cui, ACS Nano 2010, 4, 2955. DOI 10.1021/nn1005232
M. Chen, X. Xue, T. Qin, C. Wen, Q. Hao and X. Tang, Adv. Mater. Technol. 2023, 8, 2300315. DOI 10.1002/admt.202300315
M. Kim, I.-w. Choi, S. J. Choi, J. W. Song, S.-I. Mo, J.-H. An, Y. Jo, S. Ahn, S. K. Ahn, G.-H. Kim and D. S. Kim, Joule 2021, 5, 659.
M. M. Ackerman, M. Chen, P. Guyot-Sionnest, M. et al., Appl. Phys. Lett. 2020, 116, 083502. DOI 10.1063/1.5143252
M. M. Ackerman, PhD dissertation, University of Chicago 2020
M. M. Ackerman, X. Tang, P. Guyot-Sionnest, ACS Nano 2018, 12, 7264. DOI 10.1021/acsnano.8b03425
M. M. Al Mahfuz, J. Park, R. Islam, D.-K. Ko, Chem. Commun. 2023, 59, 10722. DOI 10.1039/D3CC02203J
M. Park, D. Choi, Y. Choi, H.-b. Shin, K. S. Jeong, ACS Photonics 2018, 5, 1907. DOI 10.1021/acsphotonics.8b00291
M. R. Scimeca, N. Mattu, I. J. Paredes, M. N. Tran, S. J. Paul, E. S. Aydil, A. Sahu, J. Phys. Chem. C 2021, 125, 17556. DOI 10.1021/acs.jpcc.1c05371
N. Graddage, J. Ouyang, J. Lu, T.-Y. Chu, Y. Zhang, Z. Li, X. Wu, P. R. L. Malenfant, Y. Tao, ACS Appl. Nano Mater. 2020, 3, 12209. DOI 10.1021/acsanm.0c02686
N. Sharma, N. M. Nair, G. Nagasarvari, D. Ray, P. Swaminathan, Flex. Print. Electron. 2022, 7, 014009. DOI 10.1088/2058-8585/ac5214
P. Guyot-Sionnest, J. A. Roberts, Appl. Phys. Lett. 2015, 107, 253104. DOI 10.1063/1.4938135

P. Guyot-Sionnest, M. M. Ackerman, X. Tang, J. Chem. Phys. 2019, 151, 060901. DOI 10.1063/1.5115501
P. Rastogi, A. Chu, T. H. Dang, T. Prado, C. Gréboval, J. Qu, C. Dabard, A. Khalili, E. Dandeu, B. Fix, X. Z. Xu, S. Ithurria, G. Vincent, B. Gallas, E. Lhuillier, Adv. Opt. Mater. 2021, 9, 2002066. DOI 10.1002/adom.202002066
P. Rastogi, E. Izquierdo, C. Gréboval, M. Cavallo, A. Chu, T. H. Dang, A. Khalili, C. Abadie, R. Alchaar, S. Pierini, H. Cruguel, N. Witkowski, J. K. Utterback, T. Brule, X. Z. Xu, P. Hollander, A. Querghi, B. Gallas, M. G. Silly, E. Lhuillier, J. Phys. Chem. C 2022, 126, 13720. DOI 10.1021/acs.jpcc.2c02044
P. Zhao, G. Mu, C. Wen, Y. Qi, H. Lv, X. Tang, Phys. Status Solid-Rapid Res. Lett. 2023, DOI: 10.1002/pssr.202300121, 2300121. DOI 10.1002/pssr.202300121
P. Zhao, T. Qin, G. Mu, S. Zhang, Y. Luo, M. Chen, X. Tang, J. Mater. Chem. C 2023, 11, 2842. DOI 10.1039/D3TC00066D
R. Alchaar, A. Khalili, N. Ledos, T. H. Dang, M. Lebreton, M. Cavallo, E. Bossavit, H. Zhang, Y. Prado, X. Lafosse, V. Parahyba, P. Potet, D. Darson, E. Lhuillier, Appl. Phys. Lett. 2023, 123, 051108. DOI 10.1063/5.0157348
R. Alchaar, C. Dabard, D. Mastrippolito, E. Bossavit, T. H. Dang, M. Cavallo, A. Khalili, H. Zhang, L. Domenach, N. Ledos, Y. Prado, D. Troadec, J. Dai, M. Tallarida, F. Bisti, F. Cadiz, G. Patriarche, J. Avila, E. Lhuillier, D. Pierucci, J. Phys. Chem. C 2023, 127, 12218. DOI 10.1021/acs.jpcc.3c01603
R. Saran, R. J. Curry, Nat. Photon 2016, 10, 81. DOI 10.1038/nphoton.2015.280
R. Zhang, M. Engholm, Nanomaterials 2018, 8, 628. DOI 10.3390/nano8080628
S. Azadi, S. Peng, S. A. Moshizi, M. Asadnia, J. Xu, I. Park, C. H. Wang, S. Wu, Adv. Mater. Technol. 2020, 5, 2000426. DOI 10.1002/admt.202000426
S. B. Hafiz, M. M. Al Mahfuz, D.-K. Ko, ACS Appl. Mater. Interfaces 2021, 13, 937. DOI 10.1021/acsami.0c19450
S. B. Hafiz, M. M. Al Mahfuz, S. Lee, D.-K. Ko, ACS Appl. Mater. Interfaces 2021, 13, 49043. DOI 10.1021/acsami.1c14749
S. Devaraju, A. K. Mohanty, D.-h. Won, H.-j. Paik, Mater. Adv. 2023, 4, 1769. DOI 10.1039/D3MA00031A
S. Kundu, D. Huitink, K. Wang, H. Liang, J. Colloid Interface Sci. 2010, 344, 334. DOI 10.1016/j.jcis.2010.01.004
S. Zhang, C. Bi, T. Qin, Y. Liu, J. Cao, J. Song, Y. Huo, M. Chen, Q. Hao, X. Tang, ACS Photonics 2023, 10, 673. DOI 10.1021/acsphotonics.2c01699
Solems, Transparent conductive oxides, https://www.solems.com/wpcontent/uploads/FTO_ITO_15.pdf, accessed: October 2023.
T. H. Dang, M. Cavallo, A. Khalili, C. Dabard, E. Bossavit, H. Zhang, N. Ledos, Y. Prado, X. Lafosse, C. Abadie, D. Gacemi, S. Ithurria, G. Vincent, Y. Todorov, C. Sirtori, A. Vasanelli, E. Lhuillier, Nano Lett. 2023, 23, 8539. DOI 10.1021/acs.nanolett.3c02306
T. H. Dang, M. Cavallo, A. Khalili, E. Bossavit, H. Zhang, Y. Prado, C. Abadie, E. Dandeu, S. Ithurria, G. Vincent, Y. Todorov, C. Sirtori, A. Vasanelli, E. Lhuillier, ACS Photonics 2024, 11, 1928. DOI 10.1021/acsphotonics.3c01896
T. Hori, T. Shibata, V. Kittichungchit, H. Moritou, J. Sakai, H. Kubo, A. Fujii, M. Ozaki, Thin Solid films 2009, 518, 522. DOI 10.1016/j.tsf.2009.07.044
T. Nakotte, S. G. Munyan, J. W. Murphy, S. A. Hawks, S. Kang, J. Han, J. Mater. Chem. C 2022, 10, 790. DOI 10.1039/d1tc05359k
T. Qin, G. Mu, P. Zhao, Y. Tan, Y. Liu, S. Zhang, Y. Luo, Q. Hao, M. Chen, X. Tang, Sci. Adv. 2023, 9, eadg7827. DOI 10.1126/sciadv.adg7827
W. Gong, P. Wang, D. Dai, Z. Liu, L. Zheng, Y. Zhang, J. Mater. Chem. C 2021, 9, 2994. DOI 10.1039/D0TC05902A
W. Lan, Y. Chen, Z. Yang, W. Han, J. Zhou, Y. Zhang, J. Wang, G. Tang, Y. Wei, W. Dou, Q. Su, E. Xie, ACS Appl. Mater. Interfaces 2017, 9, 6644. DOI 10.1021/acsami.6b16853
X. He, R. He, A. l. Liu, X. Chen, Z. Zhao, S. Feng, N. Chen, M. Zhang, J. Mater. Chem. C 2014, 2, 9737. DOI 10.1039/C4TC01484G
X. Shen, J. C. Peterson, P. Guyot-Sionnest, ACS Nano 2022, 16, 7301. DOI 10.1021/acsnano.2c01694
X. Tang, M. Chen, A. Kamath, M. M. Ackerman, P. Guyot-Sionnest, ACS Photonics 2020, 7, 1117. DOI 10.1021/acsphotonics.0c00247
X. Tang, M. M. Ackerman, G. Shen, P. Guyot-Sionnest, Small 2019, 15, 1804920. DOI 10.1002/smll.201804920
X. Tang, M. M. Ackerman, M. Chen, P. Guyot-Sionnest, Nat. Photon 2019, 13, 277. DOI 10.1038/s41566-019-0362-1
X. Xue, Y. Luo, Q. Hao, J. Cao, X. Tang, Y. Liu, M. Chen, ACS Photonics 2023, DOI: 10.1021/acsphotonics.3c01070. DOI 10.1021/acsphotonics.3c01070
X.-Y. Zeng, Q.-K. Zhang, R.-M. Yu, C.-Z. Lu, Adv. Mater. 2010, 22, 4484. DOI 10.1002/adma.201001811
Y. Luo, Y. Tan, C. Bi, S. Zhang, X. Xue, M. Chen, Q. Hao, Y. Liu, X. Tang, APL Photonics 2023, 8, 056109. DOI 10.1063/5.0145374
Y. Tian, H. Luo, M. Chen, C. Li, S. V. Kershaw, R. Zhang, A. L. Rogach, Nanoscale 2023, 15, 6476. DOI 10.1039/D2NR07309A
Y. Xu, Q. Lin, Appl. Phys. Rev. 2020, 7, 011315. DOI 10.1063/1.5144840

While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

What is claimed is:

1. An opto-electronic device, comprising:

a bottom contact;

a plurality of layers of semiconducting materials positioned over the bottom contact; and a top contact positioned over a semiconductor diode, the top contact comprising a thin film of an optically transparent polymer with a plurality of metal nanowires suspended therein;

wherein a loading of the metal nanowires in the polymer thin film is between 5 and 50 wt %.

2. The device of claim 1, wherein the top contact has a sheet resistance less than 20 Ohm/sq.

3. The device of claim 1, wherein the metal nanowires comprise more than one type of metal.

4. The device of claim 1, wherein the metal nanowires comprise silver.

5. The device of claim 1, wherein the metal nanowires comprise gold.

6. The device of claim 1, wherein the metal nanowires comprise platinum.

7. The device of claim 1, wherein the metal nanowires comprise copper.

8. The device of claim 1, wherein the polymer is at least 50% transparent.

9. The device of claim 1, wherein the metal nanowires have a diameter in the range of 10 to 200 nm and have a length in the range of 10 to 50 μm.

10. The device of claim 1, wherein the metal nanowires have a diameter in the range of 110 nm to 130 nm and have a length in the range of 30 to 50 μm.

11. The device of claim 1, wherein the metal nanowires are distributed such that metal nanowire junctions are established to create a spatially uniform sheet resistance.

12. The device of claim 11, wherein the metal nanowires are sufficiently loaded such that the metal nanowire junctions are established to create a stable sheet resistance.

13. The device of claim 1, wherein the loading of metal nanowires ranges from 10-30 wt %.

14. The device of claim 1, wherein the optically transparent polymer comprises polyvinyl alcohol (PVA).

15. The device of claim 1, wherein the optically transparent polymer comprises polyvinylidene fluoride (PVDF).

16. The device of claim 1, wherein the optically transparent polymer comprises polyimide (PI).

17. The device of claim 1, wherein the top contact comprises an inkjet printed, spin coated, spray coated, dip coated, or drop coated layer.

18. The device of claim 1, wherein the bottom contact comprises Indium Tin Oxide (ITO).

19. The device of claim 1, wherein plurality of layers of semiconducting materials comprises an electron transport layer (ETL) over the bottom contact, a photodetection layer comprising colloidal quantum dots over the ETL, and a hole transport layer over the photodetection layer and below the top contact.

20. The device of claim 19, wherein the ETL comprises $TiO_2$, the photodetection layer comprises HgTe, and the HTL comprises $MoO_3$.

* * * * *